US012635147B2

(12) United States Patent
Wu et al.

(10) Patent No.: US 12,635,147 B2
(45) Date of Patent: May 19, 2026

(54) MEMORY SELECTOR

(71) Applicant: Taiwan Semiconductor Manufacturing Co., Ltd., Hsinchu (TW)

(72) Inventors: Cheng-Hsien Wu, Hsinchu (TW); Xinyu Bao, Fremont, CA (US); Elia Ambrosi, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 783 days.

(21) Appl. No.: 17/889,043

(22) Filed: Aug. 16, 2022

(65) Prior Publication Data

US 2023/0371279 A1 Nov. 16, 2023

Related U.S. Application Data

(60) Provisional application No. 63/364,501, filed on May 11, 2022.

(51) Int. Cl.
*H10B 63/00* (2023.01)
*H10N 70/00* (2023.01)
*H10N 70/20* (2023.01)

(52) U.S. Cl.
CPC ............. *H10B 63/24* (2023.02); *H10B 63/84* (2023.02); *H10N 70/021* (2023.02); *H10N 70/063* (2023.02); *H10N 70/231* (2023.02); *H10N 70/841* (2023.02); *H10N 70/882* (2023.02)

(58) Field of Classification Search
CPC ............ H01L 21/31056; H10N 70/063; H10N 70/882; H10B 63/24; H10B 63/80
See application file for complete search history.

(56) References Cited

U.S. PATENT DOCUMENTS

| | | | |
|---|---|---|---|
| 2016/0020256 A1* | 1/2016 | Sciarrillo | H10N 70/8828 |
| | | | 257/4 |
| 2018/0287055 A1 | 10/2018 | Park | |
| 2018/0315475 A1 | 11/2018 | Redaelli et al. | |
| 2020/0052205 A1* | 2/2020 | Miao | H10N 70/063 |
| 2020/0212105 A1 | 7/2020 | Majhi et al. | |
| 2021/0111341 A1* | 4/2021 | Liu | H10N 70/826 |
| 2021/0111342 A1 | 4/2021 | Liu | |
| 2021/0280781 A1 | 9/2021 | Kim et al. | |
| 2022/0069011 A1* | 3/2022 | Ahn | H10N 70/882 |
| 2022/0109025 A1 | 4/2022 | Majhi et al. | |
| 2022/0140003 A1 | 5/2022 | Yang et al. | |

FOREIGN PATENT DOCUMENTS

| | | | |
|---|---|---|---|
| TW | 201907403 A | 2/2019 | |

* cited by examiner

*Primary Examiner* — Shih Tsun A Chou
(74) *Attorney, Agent, or Firm* — Slater Matsil, LLP

(57) ABSTRACT

Embodiments include a method of forming a cross-point memory device, the method and device forming a multi-layered selector material. A first level of the multi-layered selector structure may include a subset of the elements of a second level of the multi-tiered selector structure. A gradient concentration of the switching elements may be found in the selector structure, first level including a substantially steady concentration of elements and the second level including a gradient of concentration for the elements in common as well as the elements unique to the first level.

20 Claims, 43 Drawing Sheets

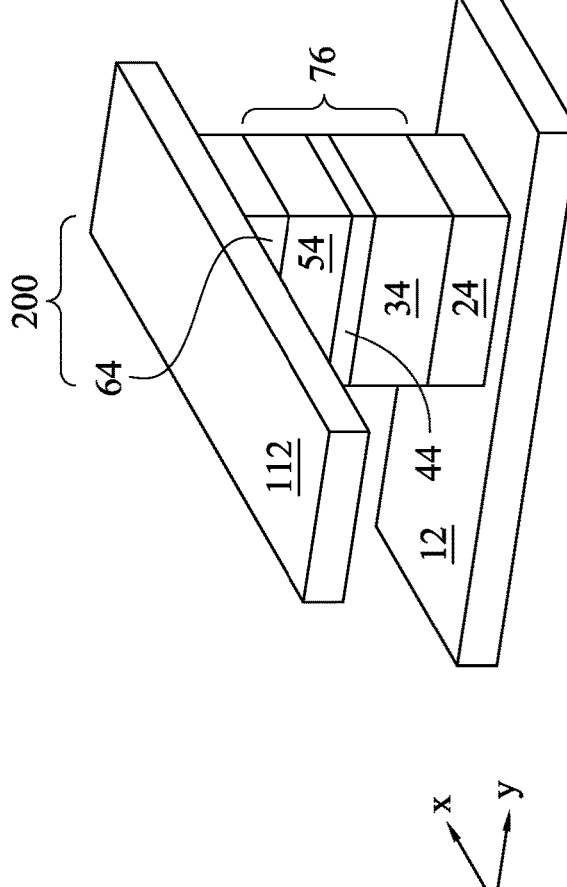
Fig. 4A
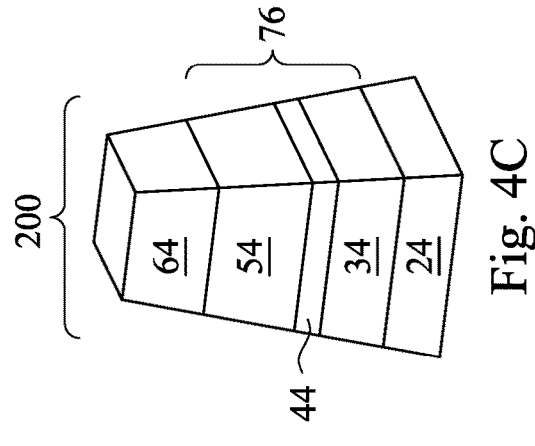
Fig. 4D
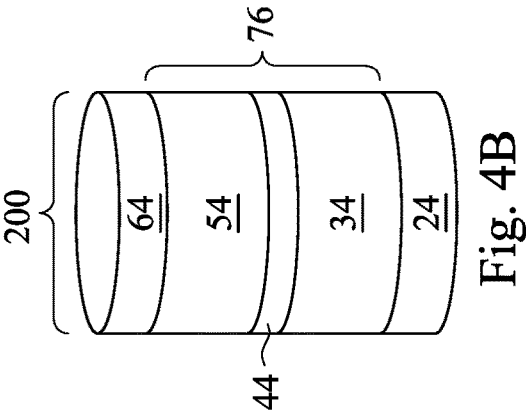
Fig. 4C
Fig. 4B

MEMORY SELECTOR

PRIORITY CLAIM AND CROSS-REFERENCE

This application claims the benefit of U.S. Provisional Application No. 63/364,501, filed on May 11, 2022, which application is hereby incorporated herein by reference.

BACKGROUND

Semiconductor memories are used in integrated circuits for electronic applications, including radios, televisions, cell phones, and personal computing devices, as examples. One type of semiconductor memory is phase-change random access memory (PCRAM), which involves storing values in phase change materials, such as chalcogenide materials. Phase change materials can be switched between an amorphous phase (in which they have a high resistivity) and a crystalline phase (in which they have a low resistivity) to indicate bit codes. A PCRAM cell typically includes a phase change material (PCM) element between two electrodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A, 4B, 4C, and 4D illustrate various configurations of the memory cell, in accordance with some embodiments.

FIGS. 6 through 26A and 26B and FIGS. 30A, 30B, 31A, and 31B provide intermediate views of the formation of a memory array 300, in accordance with some embodiments.

DETAILED DESCRIPTION

Figure 1:
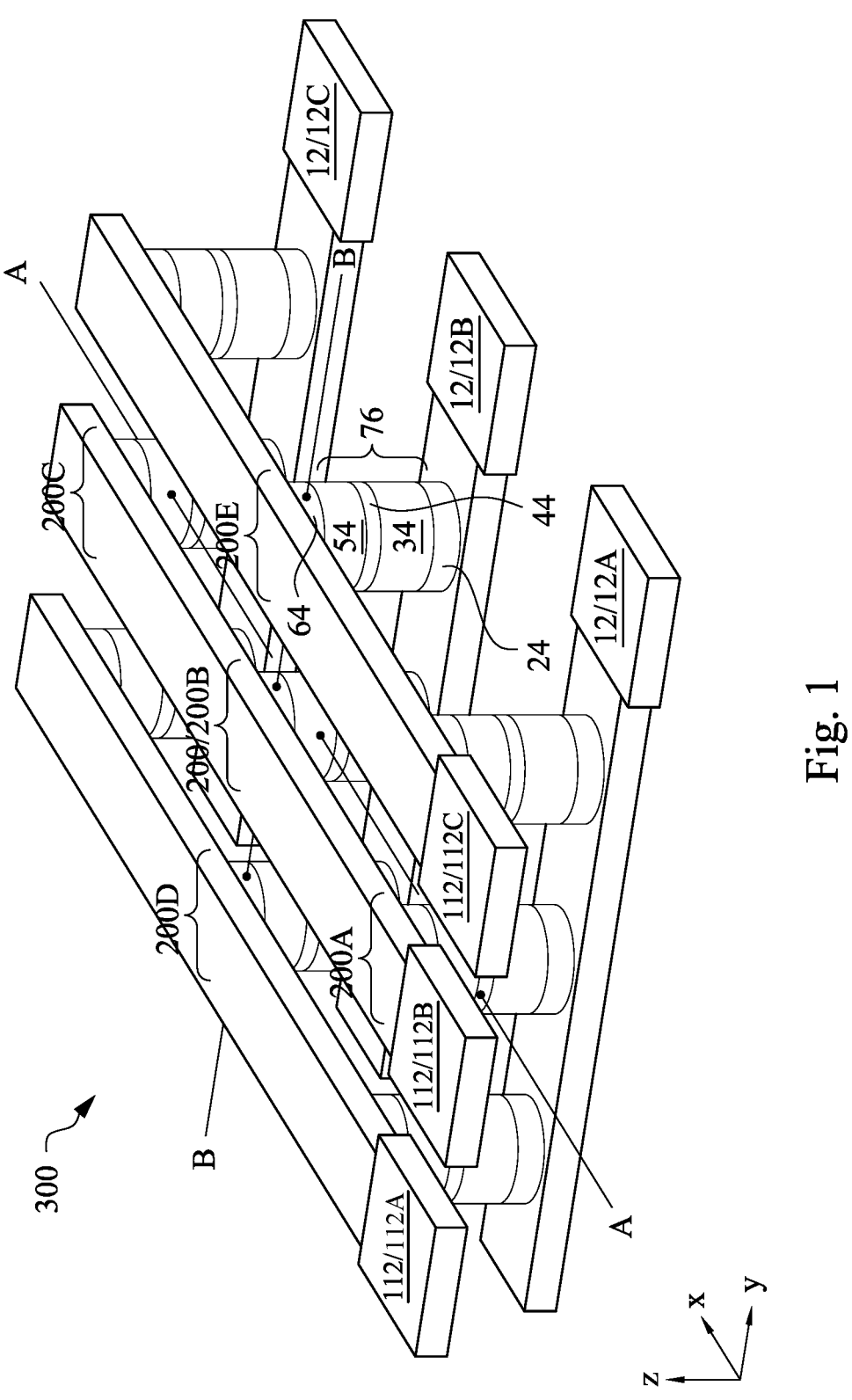
FIG. 1 illustrates a perspective view of an array of cross-point or crossbar memory cells in a memory array, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments utilize a selector layer structure of a memory cell which has multiple layers. The switching materials gradually increase in concentration percentage from the outside in, thereby resulting in better switching performance. There is less interference between the switching layers and nearby metal layers. Also, improved switching performance includes sharper on/off switching profiles than would be realized in a single layer selector structures, and smaller cycle-to-cycle Vth variation and smaller device-to-device Vth variation. Memory cells may be formed using a variety of configurations of the multi-layer selector structure and memory elements.

FIG. 1 illustrates a perspective view of an array of cross-point or crossbar memory cells 200 in a memory array 300, in accordance with some embodiments. The memory array 300 comprises bit lines 12, word lines 112, and memory cells 200 connected in a "cross-point" configuration, where addressing of a particular bit line 12 and a particular word line 112 together selects a particular memory cell 200. In some embodiments, memory arrays 300 may be stacked to create a 3D memory array (not shown). The memory array 300 may be formed on a substrate (see, e.g., substrate 2 of FIG. 6), which may be a semiconductor substrate or another type of substrate. The substrate may include active and/or passive devices (e.g., transistors, diodes, capacitors, resistors, or the like), in some embodiments. The devices may be formed according to applicable manufacturing processes. In some embodiments, no devices are formed in the substrate. In some embodiments, the memory array 300 is formed in the metallization layers of an interconnect structure over the substrate. The memory array 300 may be electrically connected to one or more of the metallization layers. For example, in some embodiments, the word lines 112 and/or the bit lines 12 may be conductive lines of the metallization layers.

In the embodiment shown in FIG. 1, each memory cell 200 comprises a bottom electrode 24, a memory storage structure 34, an intermediate layer 44, a selector structure 54, and a top electrode 64. The elements between the top electrode 64 and bottom electrode 24, including, for example, the memory storage structure 34, intermediate layer 44, and selector layer 54 may be referred to as the memory elements 76. The bit lines 12 are electrically connected to the bottom electrodes 24 of respective columns of memory cells 200 in the memory array 300. Each column of the memory array 300 has an associated bit line 12 (e.g., bit line 12A, 12B, or 12C), and the memory cells 200 in a column are connected to the same bit line 12 for that column. The word lines 112 are connected to the top electrodes 64 of respective rows of memory cells 200 in the memory array 300. Each row of the memory array 300 has an associated word line 112 (e.g., word line 124A, 124B, 124C), and the memory cells 200 in a row are connected to the word line 112 for that row. In this manner, each memory cell 200 of the memory array 300 may be selected by the appropriate combination of word line 112 and bit line 12. For example, a particular memory cell 200B may be selected (e.g., for reading or writing operations) by accessing the single word line 112B connected to the memory cell 200B and also accessing the single bit line 12B connected to the memory cell 200. Other memory cells which are particularly labeled in FIG. 1 include 200A, 200C, 200D, and 200E, which are along the reference lines A-A (200A, 200B, 200C) and B-B (200D, 200B, 200E), which are utilized as cross-section reference lines in some of the proceeding figures.

In some embodiments, the resistance of the memory storage structure 34 of each memory cell 200 is programmable, and can be changed between a high-resistance state and a low-resistance state, which can correspond to the two states of a binary code. The memory storage structure 34 may utilize any appropriate technology, and this disclosure should not be limited to any particular type of memory storage technology. For example, the memory storage structure 34 may include phase-change material (PCM) for a PCRAM (phase-change random access memory) device, a two-state resistive material for an RRAM (resistive random access memory) device, a magnetic tunnel junction (MTJ) for an MRAM (magnetic random access memory) device. Other memory types may be used.

In some embodiments, the resistance state of the memory storage structure 34 of a memory cell 200 can be programmed (e.g., "written") by applying an appropriate electrical voltage pulse across the memory cell 200 that generates a corresponding electrical current pulse across the memory storage structure 34. The current necessary to alter the resistive state of the memory storage structure 34 is design specific. Because a larger percentage of the resistance of the memory cell 200 is provided by the memory storage structure 34, the realized current pulse is dependent on the resistivity of the memory storage structure 34. For example, in some embodiments, the magnitude of a programming current pulse may be in the range of about 50 μA to about 800 μA, though other currents are possible. The applied programming voltage also depends on the memory storage structure 34. For example, the reading of a particular memory cell 200 may be forward biased and the writing may be reversed biased or vice versa. In some cases, the magnitude of a programming voltage pulse may be in the range of about 1 V to about 2 V, though other voltages are possible. In some embodiments, the state of a memory cell 200 may be read by applying a relatively small electrical current across the memory cell 200 that allows the resistance of the memory cell 200 to be measured without disturbing the resistance state of the memory storage structure 34. Other types of memory or memory architecture may use different read schemes or magnitudes than this example.

The selector structure 54 of each memory cell 200 is used as a selector that allows the respective memory cell 200 to be accessed (e.g., written or read) individually. In this manner, a selector structure 54 of a memory cell 200 may also be referred to herein as "selector 54." The selector structure 54 may utilize ovonic threshold switching (OTS) or variations thereof, such as, mixed-ionic-electronic conduction (MIEC), and so forth. For simplicity, all such variations will also be referred to as OTS.

Figure 2B:
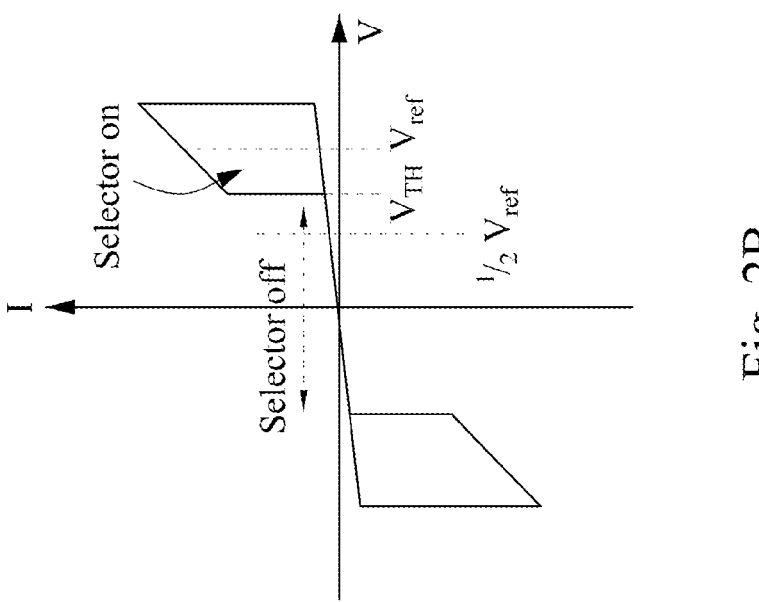
FIG. 2B illustrates a characteristic of a selector switching structure, in accordance with some embodiments.
Figure 2A:
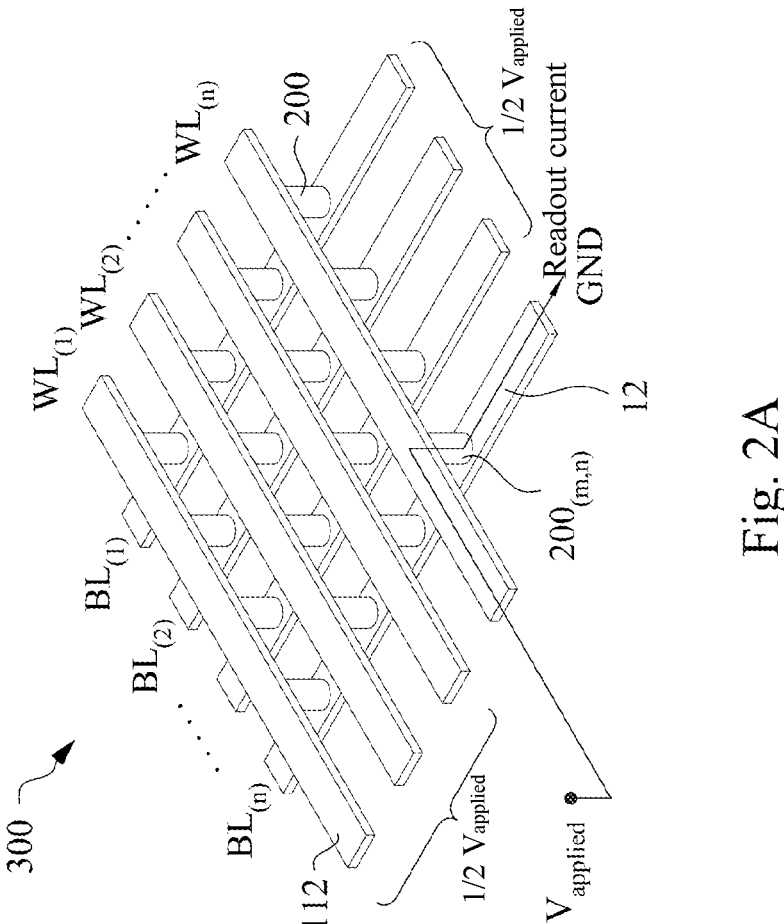
FIG. 2A illustrates a simplified version of a memory cell, in accordance with some embodiments.

Referring to FIGS. 2A and 2B, an OTS selector material has a characteristic property called the threshold voltage ($V_{TH}$). At applied voltages below $V_{TH}$ (e.g., at subthreshold voltages), the OTS selector material is in a high-resistance state, limiting current through the OTS selector material. At applied voltages greater than $V_{TH}$, the OTS selector material is in a low-resistance state that creates a current path through the OTS selector material. When an OTS selector material is utilized in the memory elements 76 of the memory cell 200, these properties of the OTS selector material may be used to activate a particular memory cell 200 without affecting neighboring memory cells for write or read operations. In this manner, write operations may be performed on a memory cell 200 only when the voltage across the selector structure 54 is greater than $V_{TH}$.

FIG. 2A illustrates a simplified version of a memory array 300, such as that illustrated in FIG. 1. The memory array 300 in FIG. 2A includes bit lines 12, labelled BL(1)-BL(n) and word lines 112, labelled WL(1)-WL(m), where n is the total number of bitlines and m is the total number of word lines in the memory array 300, such that the number of memory cells 200 in the memory array is m x n. As illustrated in FIG. 2A, a particular memory cell 200($m,n$) may be selected using the selector structure 54 by applying the voltage Vapplied to the word line WL(m) and applying a ground to the bit line BL(n), where Vapplied is greater than the VTH of the selector structure 54 of the memory cell 200($m,n$). The other bitlines 12 and word lines 112 can have applied a reference voltage equal to ½Vapplied, or some other voltage which causes the selector structure 54 to be in a high-resistance state.

The behavior of the selector structure 54 as described above is modeled in FIG. 2B. The reference voltage $V_{ref}$ may be equal to the voltage $V_{applied}$ from FIG. 2A. When the voltage $V_{TH}$ is reached, the selector structure 54 is "on" and thus exhibits a lower resistance state such that current can pass through the selector structure 54. In contrast, when the voltage $V_{TH}$ is not reached, the selector structure 54 is "off" and thus exhibits a high resistance state such that little current can pass through the selector structure 54. The reference voltage $V_{ref}$ is above the threshold $V_{TH}$, whereas the voltage ½$V_{ref}$ is below the threshold $V_{TH}$.

In some embodiments, the magnitude of the threshold voltage $V_{TH}$ is in the range of about 1 V to about 2 V, though other voltages are possible. In some cases, the threshold voltage $V_{TH}$ can be tuned, for example, by adjusting the materials or thicknesses of the various layers.

Figure 3:
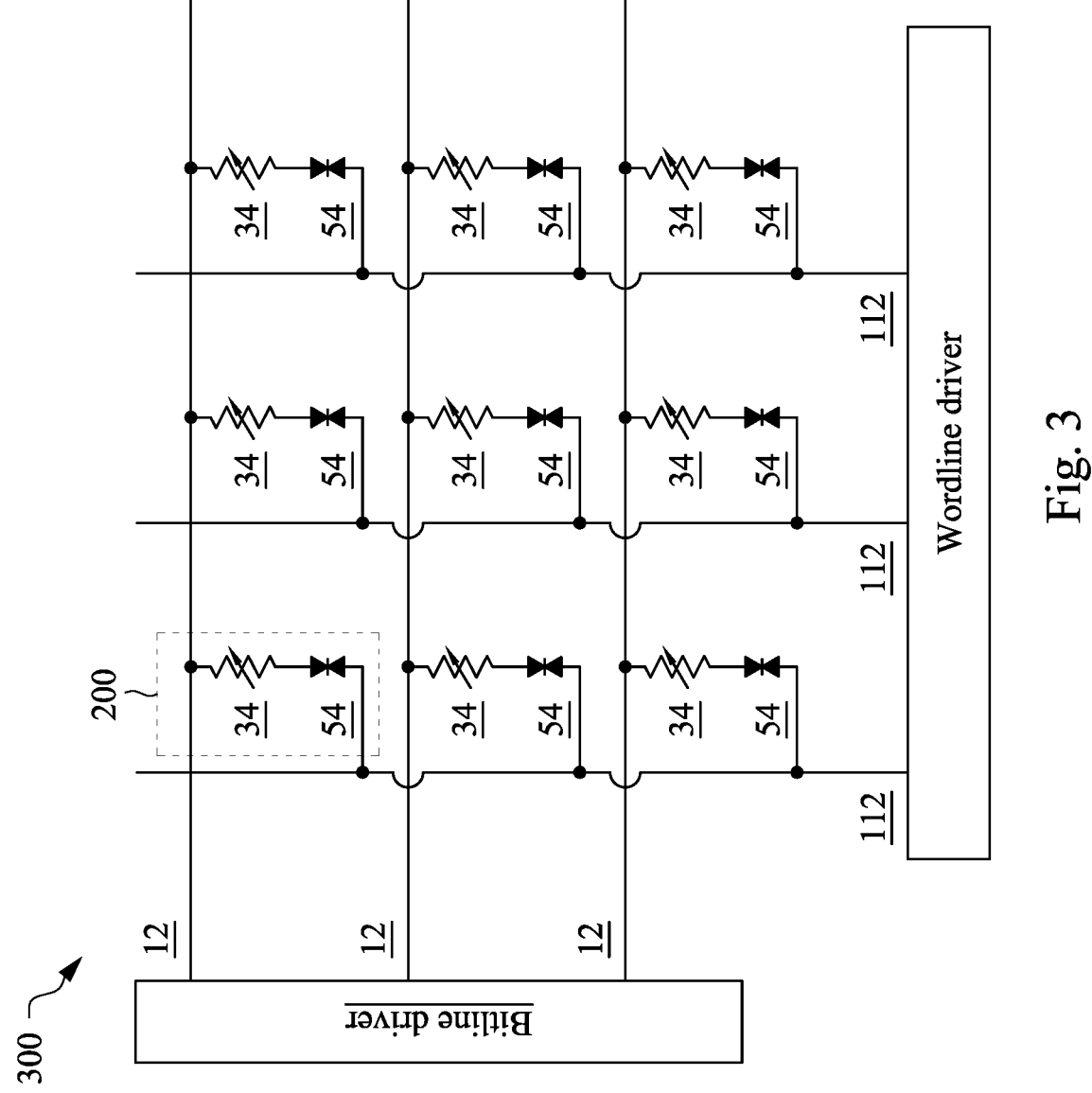
FIG. 3 illustrates a circuit schematic view of the memory array, in accordance with some embodiments.

FIG. 3 illustrates a circuit schematic view of the memory array 300. Some elements have been removed for clarity. A bitline driver controls the voltage signals to the various conductive bitlines 12 and a word line driver controls the voltage signals to the various conductive word lines 112. The memory cells 200 include the memory storage structure 34 and selector structure 54. They may be in either order. When a reference voltage is supplied to activate a memory cell 200, in a read operation the resulting current response may be read to determine whether the value was a '1' or '0'. A write operation may depend on the type of memory storage structure 34 utilized. In some embodiments, for example, a large voltage bias may be applied, while in others a reverse voltage bias may be applied.

FIGS. 4A, 4B, 4C, and 4D illustrate various configurations of the memory cell 200. The various configurations result from the patterning processes used to form the pillars corresponding to the memory cells 200. In FIG. 4A, the memory cell 200 has a shape resembling a rectangular prism. The corners may be rounded in some embodiments or relatively squared off in other embodiments. In FIG. 4B, the memory cell 200 has a cylindrical shape. In FIG. 4C, the memory cell 200 has a pyramid shape. In FIG. 4D, the memory cell 200 has a conical shape. The memory cells 200 in FIGS. 4A, 4B, 4C, and 4D may achieve such shapes by depositing each of the layers of the memory cells such as illustrated in FIG. 7, and patterning the memory cells 200 through a mask using acceptable photolithographic processes. In such embodiments, the bitlines 12 are formed and separated prior to depositing the layers of the memory cells 200, again using acceptable photolithographic processes and deposition techniques. After patterning the memory cells 200, surrounding dielectric layers, including liner layers, may be deposited to laterally surround the memory cells 200 and then the word lines 112 formed and patterned. The memory cells 200 of FIGS. 4A and 4C may instead be formed by the processes described below in FIGS. 6 through 21, the etching processes may result, for example, in the side walls of the memory cells 200 to be angled such as illustrated in FIG. 4C or straight such as illustrated in FIG. 4A.

Figure 5B:
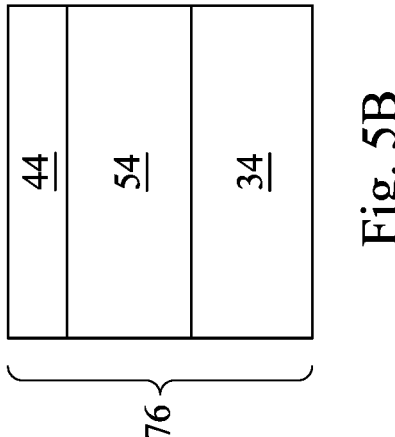
FIGS. 5A, 5B, 5C, and 5D illustrate various configurations of the memory elements of a memory cell, in accordance with some embodiments.
Figure 5D:
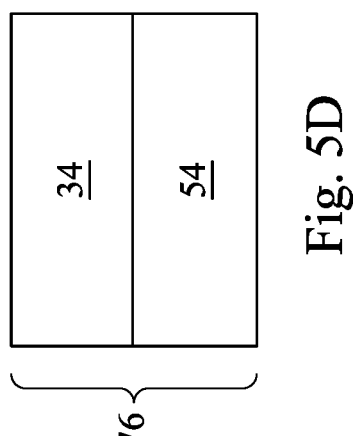
Figure 5A:
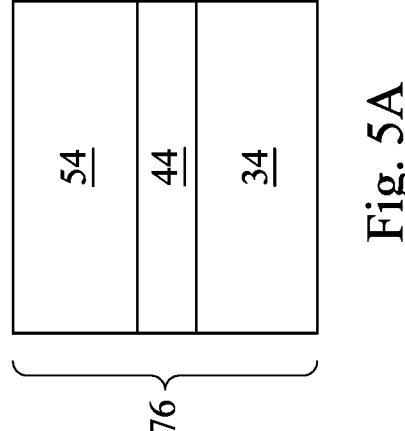
Figure 5C:
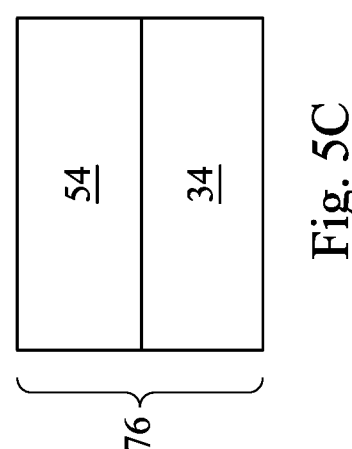

FIGS. 5A, 5B, 5C, and 5D illustrate various configurations of the memory elements 76. It should be understood that each of these configurations may be utilized in the embodiments discussed below. In particular, even though the layout of the memory elements 76 illustrated in FIG. 5A is used in the remaining Figures for illustration purposes, any of the layouts illustrated in FIGS. 5A, 5B, 5C, and 5D may be substituted. It should also be understood that variations of these which are not specifically illustrated may also be used. For example, each of the memory storage structure 34, intermediate layer 44, and selector structure 54 constitute resistive elements arranged in a series formation. As such, the order of each of these (if utilized) does not significantly affect the operation of the memory cells 200 and the principles discussed in this disclosure. FIG. 5A illustrates that the memory storage structure 34 is formed at the base of the memory elements 76, the selector structure 54 is formed at the top of the memory elements 76, and that the intermediate layer 44 is interposed between the two. FIG. 5B illustrates that the memory storage structure 34 is formed at the base of the memory elements 76, the intermediate layer 44 is formed at the top of the memory elements 76, and that the selector structure 54 is interposed between the two. FIGS. 5C and 5D omit the intermediate layer 44. In FIG. 5C the memory storage structure 34 is formed at the base of the memory elements 76 and the selector structure 54 is formed at the top of the memory elements 76. In FIG. 5D, these are reversed so that the selector structure 54 is formed at the base of the memory elements 76 and the memory storage structure 34 is formed at the top of the memory elements 76.

FIGS. 6 through 26B and 30A through 31B provide intermediate views of the formation of a memory array 300, in accordance with some embodiments. FIGS. 6, 9, 11, 13, 15, each illustrate a three-dimensional view of the intermediate processes of forming the memory array 300. Some features have been omitted or simplified for clarity. Each of these views provides reference cross section lines A-A and B-B which correspond to those provided above with respect to FIG. 1. Unless otherwise noted, the Figures which end in an A are along the A-A reference line and the Figures which end in a B are along the B-B reference line.

Figure 6:
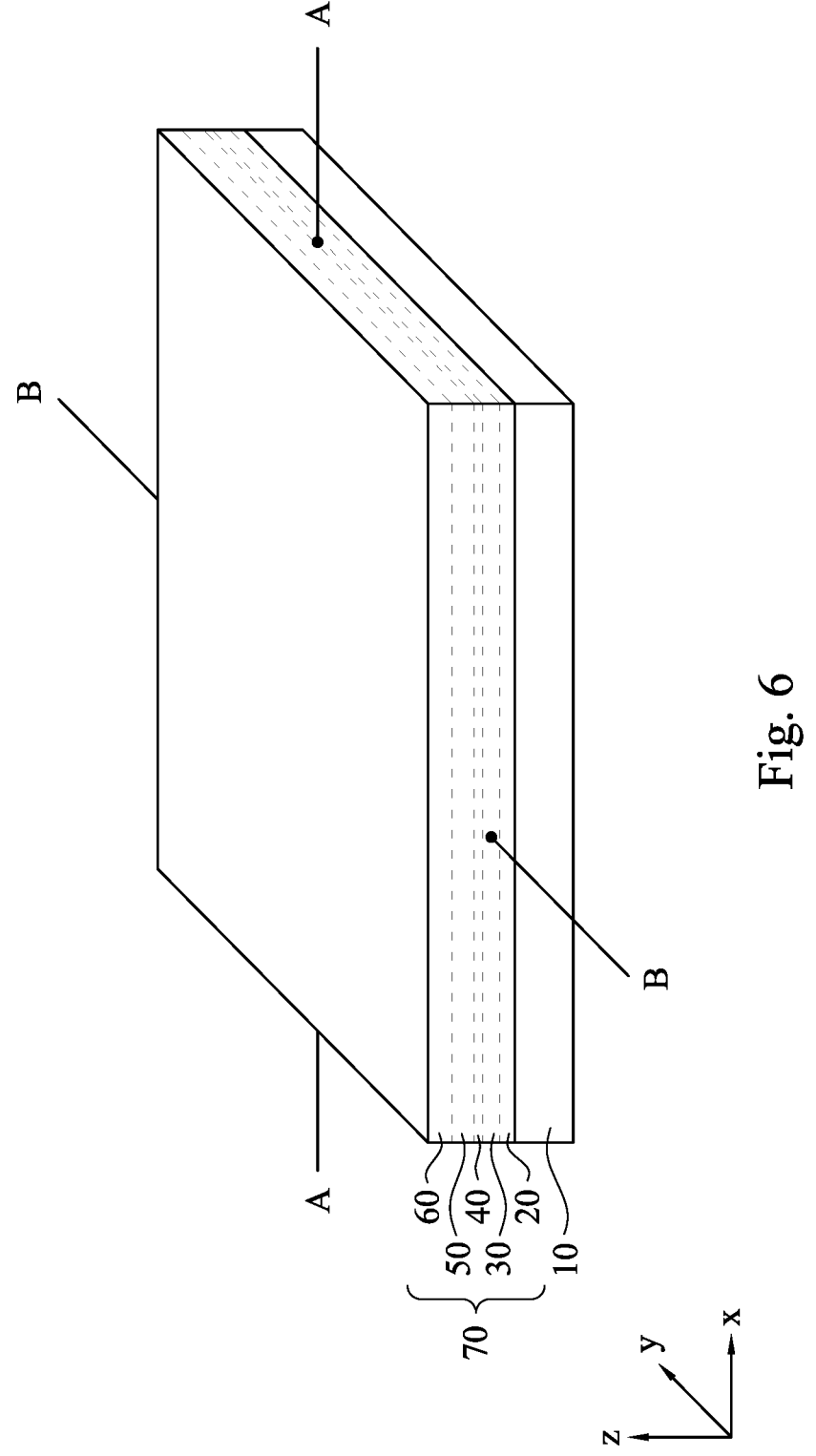
Figure 7:
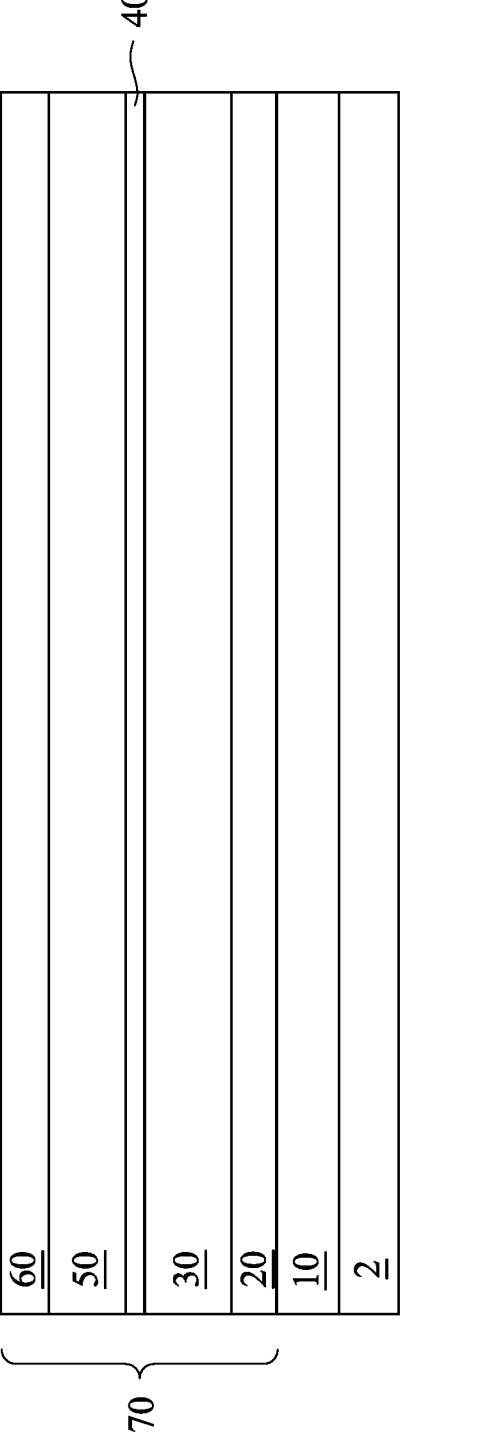

FIGS. 6 and 7 illustrate the formation of layers of the memory array 300 which will be subsequently patterned into memory cells 200. FIG. 7 in this instance illustrates a view of a cross-section which applies both to the reference cross-section A-A and B-B of FIG. 6.

A substrate 2 is provided. The substrate 2 may be any one of a number of layers or a combination of layers, depending on where the memory array is being formed. As noted above, for example, the memory array may be formed in an interconnect structure. In such embodiments, the substrate 2 can be a combination of a semiconductor substrate with or without devices formed therein with any number of metallization layers formed thereover. In some embodiments, the substrate 2 may include a semiconductor material such as silicon, silicon germanium, or the like. In some embodiments, the substrate 2 includes a crystalline semiconductor substrate such as a crystalline silicon substrate, a crystalline silicon carbon substrate, a crystalline silicon germanium substrate, a III-V compound semiconductor substrate, or the like. In an embodiment the substrate 2 may include bulk silicon, doped or undoped, or an active layer of a silicon-on-insulator (SOI) substrate. Generally, an SOI substrate comprises a layer of a semiconductor material such as silicon, germanium, silicon germanium, or combinations thereof, such as silicon germanium on insulator (SGOI). Other substrates that may be used include multi-layered substrates, gradient substrates, or hybrid orientation substrates.

In other embodiments, the substrate 2 can be a carrier substrate, such as a glass carrier, a ceramic carrier, or the like, and the memory array 300 is formed on the carrier substrate.

A bitline layer 10 is formed over the substrate 2. Any number of intervening layers and structures may be formed between the substrate 2 and the bitline layer 10, including, for example, an interconnect of which the bitline layer 10 is located at an upper metallization layer thereof. In some embodiments, such intervening layers may include active and/or passive devices.

The bitline layer 10 may be formed of any suitable conductive material. In some embodiments, for example, the bitline layer 10 may be formed of copper, gold, aluminum, ruthenium, nickel, cobalt, titanium, tungsten, titanium nitride, tantalum, tantalum nitride, the like, and combinations thereof. The bitline layer 10 may be formed of multiple discrete layers, in some embodiments. The bitline layer 10 may be formed using any suitable process, such as by physical vapor deposition (PVD), chemical vapor deposition (CVD), plating, atomic layer deposition (ALD), sputtering, and so forth. Although the bitline layer 10 is illustrated as being a blanket deposition, the bitline layer 10 may be formed using other processes, such as damascene, dual-damascene, or another suitable process.

A bottom electrode layer 20 is deposited over the bitline layer 10. The bottom electrode layer 20 may be formed of different or the same materials as the bitline layer 10, using similar processes. The bottom electrode layer 20 will be patterned into a bottom electrode for the memory cells 200 in subsequent processes.

Next, over the bottom electrode layer 20, the memory stack layers 70 are formed. These layers will be patterned in subsequent processes into the pillars 74 of the memory cells 200. For the purposes of the discussion in FIGS. 6 and 7, the memory stack layers 70 are shown as including the memory structure layers 30, the interfacial layer 40, and the selector structure layers 50, however, it should be understood that the order and/or presence of these layers may depend on the specific implementation utilized. For example, as discussed above with respect to FIGS. 5A, 5B, 5C, and 5D, which illustrate the memory stack layers 70 after being patterned into the pillars 74, corresponding memory storage structure 34, intermediate layer 44, and selector structure 54 may be arranged in a different order, and in some embodiments the intermediate layer 44 may be omitted. For simplicity, only the organization according to FIG. 5A will be shown, however, the others may readily be substituted.

The memory structure layers 30 may include any such appropriate layers for the memory technology which is utilized. For example, if the memory technology is PCRAM, then the memory structure layers 30 may include a barrier layer and a chalcogenide material layer. If the memory technology is MRAM, then the memory structure may include a free layer, a reference layer, and a pinned layer for switching the MRAM magnetic moment of the free layer. Other layers for these or other memory technologies may be utilized as appropriate. The formation of these layers may be performed using processes suitable for such layers, such as PVD, ALD, CVD, spin-on, and so forth.

The intermediate layer 40 is formed on the memory structure layers 30. The intermediate layer 40 may be formed using materials or techniques similar to those described for the bottom electrode layers 20. The selector structure layers 50 are formed on the intermediate layer 40. The formation and materials of the selector structure layers 50 are discussed in further detail with respect to FIGS. 8A, 8B, 8C, and 8D, below.

Following the formation of the selector structure layers 50, a top electrode layer 60 is formed. The top electrode layer 60 may be formed using processes and materials similar to those used to form the bottom electrode layer 20.

Figure 8A:
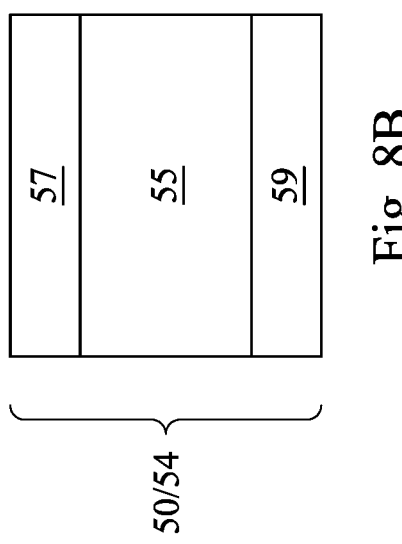
Figure 8B:
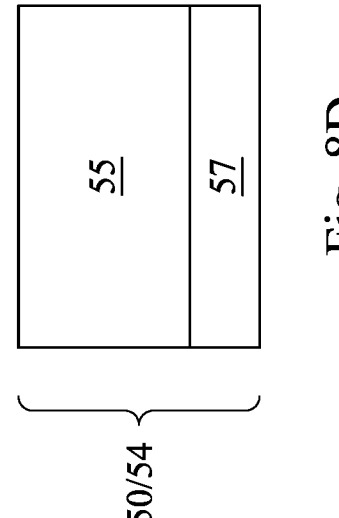
Figure 8C:
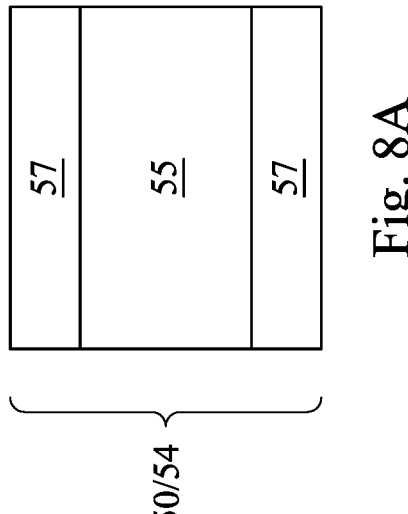
Figure 8D:
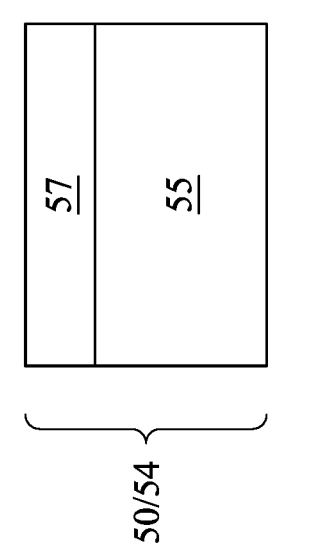

FIGS. 8A, 8B, 8C, and 8D illustrate various configurations of the selector structure layers 50, which are subsequently patterned into the selector structure 54. As seen in FIGS. 8A, 8B, 8C, and 8D, each of the configurations of the selectors structure layers 50 includes at least two layers including a first ovonic threshold switching (OTS) material layer 55 and a second OTS material layer 57. FIG. 8A illustrates a first OTS material layer 55 sandwiched between two second OTS material layers 57. In FIG. 8A, the two second OTS material layers 57 are composed of the same materials. FIG. 8B illustrates the first OTS material layer 55 sandwiched between a second OTS material layer 57 and a third OTS material layer 59. FIGS. 8C and 8D each include the first OTS material layer 55 and only one second OTS material layer 57, where the second OTS material layer 57 is disposed over (FIG. 8C) or under (FIG. 8D) the first OTS material layer 55.

Utilizing a bi-layer or sandwich selector structure provides a gradual composition profile between the multiple layers, which provides more stable device performance. A single layer OTS material layer can have large cycle-to-cycle and device-to-device $V_{th}$ variation with a switching behavior which is not sharp. In contrast, the multi-layer structures of the embodiment selector structures 54 provide improved performance with less $V_{th}$ variation and sharper switching behavior. The switching behavior depends primarily on the first OTS material layer 55, which has a higher resistance than the second OTS material layer 57 and (if used) the third OTS material layer 59. As such, when applying voltage, most of the voltage drop is across the first OTS material layer 55. The second OTS material layer 57 (and third OTS material layer 59, if used) improves interference at the interface between the overlying or underlying metal layers while driving the switching by reducing or eliminating interference. This results in better switching behavior, such as sharp turn-on/turn-off, smaller cycle-to-cycle $V_{th}$ variation, and smaller device-to-device $V_{th}$ variation. The composition profiles of the selectors structure 54 is discussed in greater detail below, with respect to FIGS. 28 and 29

The first OTS material layer 55 may be made of an alloy or composition of any suitable ovonic material, such as SiGeCTe, NSiGeCTe, NSnZnTe, SiSnTe, SiZnTe, and NSiZnSnTe, the like, or combinations thereof. The second OTS material layer 57 (and third OTS material layer 59, if used) may be made of an alloy or composition of any suitable ovonic material, such as CTe, GeCTe, SiCTe, ZnTe, and SnTe, the like, or combinations thereof. It should be understood each of the listed OTS materials contemplates suitable and appropriate ratios for each of the listed elements and is not meant to convey a particular ratio.

In some embodiments, the second OTS material layer 57 (and/or third OTS material layer 59, if used) may include a subset of the materials used in the first OTS material layer 55. For example, if the second OTS material layer 57 or third OTS material layer 59 is CTe, the first OTS material layer 55 may be GeCTe, SiGeCTe, or NSiGeCTe. If the second OTS material layer 57 or third OTS material layer 59 is GCTe, the first OTS material layer 55 may be SiGeCTe or NSiGeCTe. If the second OTS material layer 57 or third OTS material layer 59 is SiCTe, the first OTS material layer 55 may be SiGeCTe or NSiGeCTe. If the second OTS material layer 57 or third OTS material layer 59 is ZnTe, the first OTS material layer 55 may be NSnZnTe, SiZnTe, or NSiZnSnTe. If the second OTS material layer 57 or third OTS material layer 59 is SnTe, the first OTS material layer 55 may be NSnZnTe, SiSnTe, or NSiZnSnTe.

In embodiments which utilize both the second OTS material layer 57 and the third OTS material layer 59, either they may both be a subset of the first OTS material layer 55 or at least one may be a subset of the first OTS material layer 55. For example, in embodiments where both the second and third OTS material layers 57 and 59 are subsets of the first OTS material layer 55, if the first OTS material layer 55 is NSiGeCTe or SiGeCTe, then the second OTS material layer 57 and third OTS material layer 59 may be one of GeCTe, CTe, or SiCTe. If the first OTS material layer 55 is NSnZnTe, SiZnTe, NSiZnSnTe, then the second OTS material layer 57 and third OTS material layer 59 may be ZnTe or SnTe. In embodiments where only one of the second or third OTS material layers 57 or 59 is a subset of the first OTS material layer 55 and the other is allowed to have one or more additional elements, if the first OTS material layer 55 is NSiGeCTe or SiGeCTe, then one of the second OTS material layer 57 or third OTS material layer 59 may be ZnTe, SnTe, GeCTe, CTe, or SiCTe and the other may be GeCTe, CTe, or SiCTe. If the first OTS material layer 55 is NSnZnTe, SiZnTe, NSiZnSnTe, then one of the second OTS material layer 57 or third OTS material layer 59 may be ZnTe, SnTe, GeCTe, CTe, or SiCTe and the other may be ZnTe or SnTe. If the first OTS material layer 55 is SiSnTe, then one of the second OTS material layer 57 or third OTS material layer 59 may be ZnTe, SnTe, GeCTe, CTe, or SiCTe and the other may be SnTe. In some embodiments, both the second OTS material layer 57 and third OTS material layer 59 may have additional elements not found in the first OTS material layer 55.

The first OTS material layer 55, second OTS material layer 57, and third OTS material layer 59 (if used) may be deposited using any suitable technique and in the order in which they are formed (see, e.g., FIGS. 8A, 8B, 8C, and 8D). For example, these may be deposited using a suitable deposition process, such as PVD, CVD, plasma-enhanced CVD (PECVD), ALD, or the like.

The first OTS material layer 55 may be deposited to a thickness between about 5 nm and 15 nm. The second OTS material layer 57 may be deposited to a thickness between about 2.5 nm and 5 nm. When two layers of the second OTS material layer 57 are used on either side of the first OTS material layer 55, such as illustrated in FIG. 8A, then the two layers may have the same thicknesses or may have different thicknesses. The third OTS material layer 59, such as illustrated in FIG. 8B may be deposited to a thickness between about 2.5 nm and 5 nm. In FIG. 8B, the thickness of the second OTS material layer 57 and the thickness of the third OTS material layer 59 may be the same or may be different.

Figure 9:
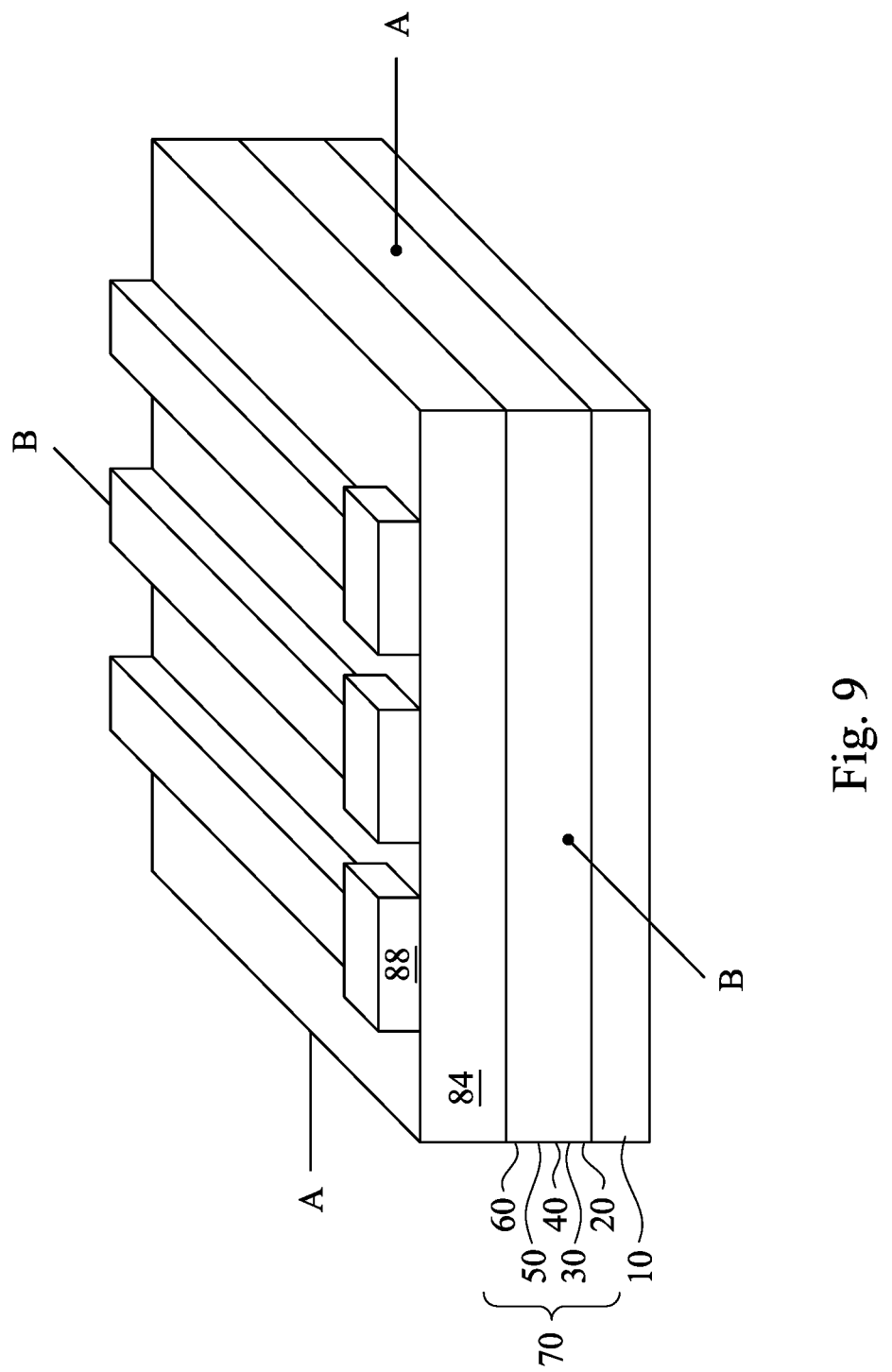
Figure 10A:
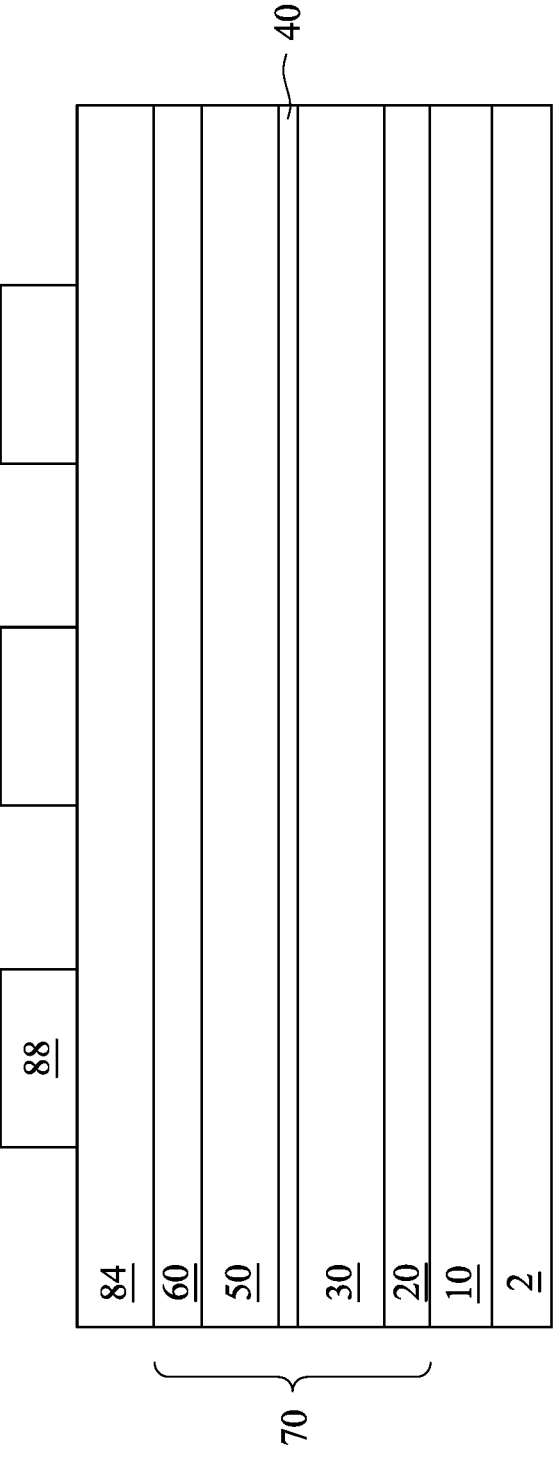
Figure 10B:
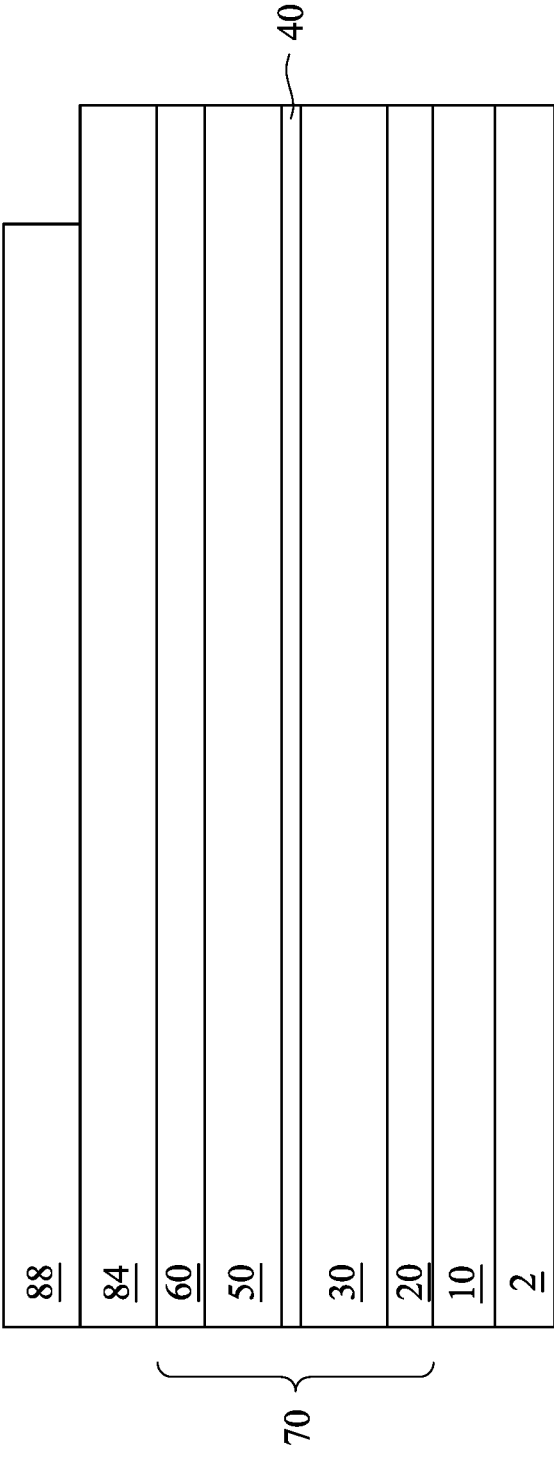

In FIGS. 9, 10A, and 10B, a hard mask layer 84 is formed over the memory stack layers 70. The hard mask layer 84 may be formed of any suitable material, such as doped or undoped silicon oxide, silicon nitride, silicon oxynitride, silicon carbide, doped silicate glass, flowable oxide, other high-k materials, low-k materials, the like, or combinations thereof. The hard mask layer 84 may be formed using any suitable process, such as by flowable CVD, spin-on, PVD, and so forth. After the hard mask layer 84 is formed, a photomask 88 is deposited over the hard mask layer 84 and patterned using acceptable photopatterning techniques.

Figure 11:
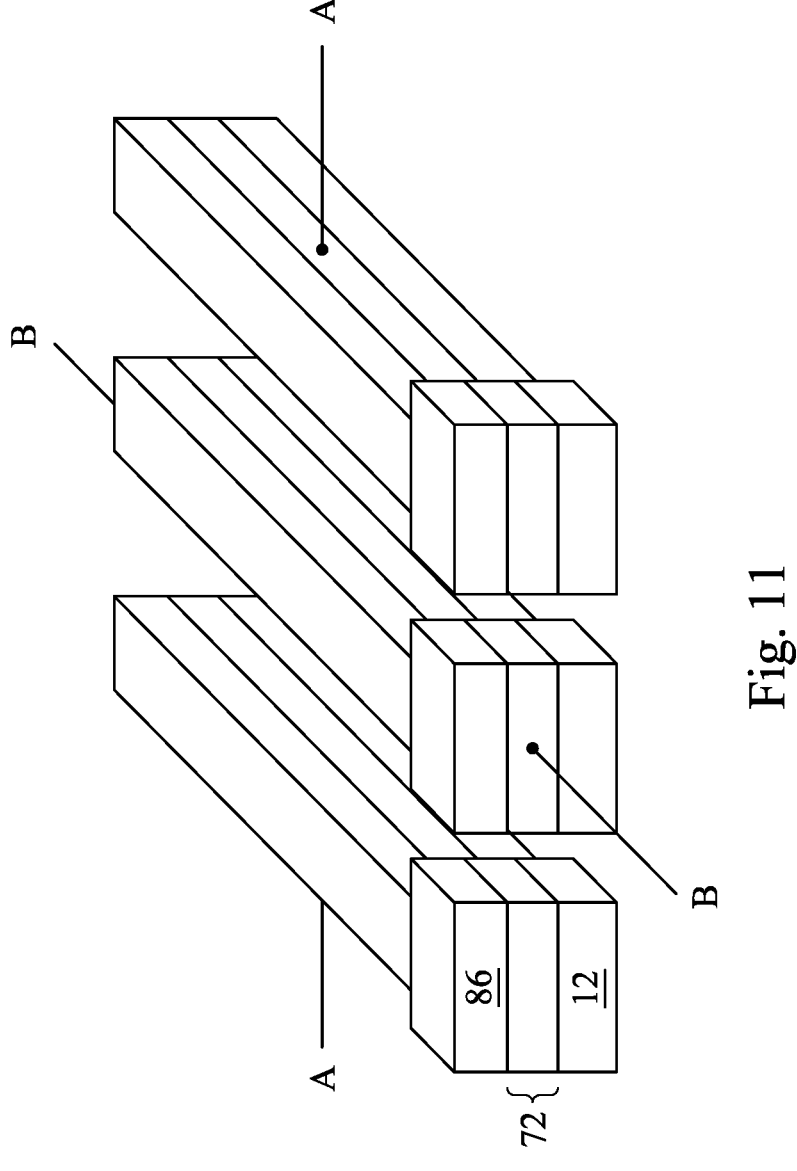
Figure 12A:
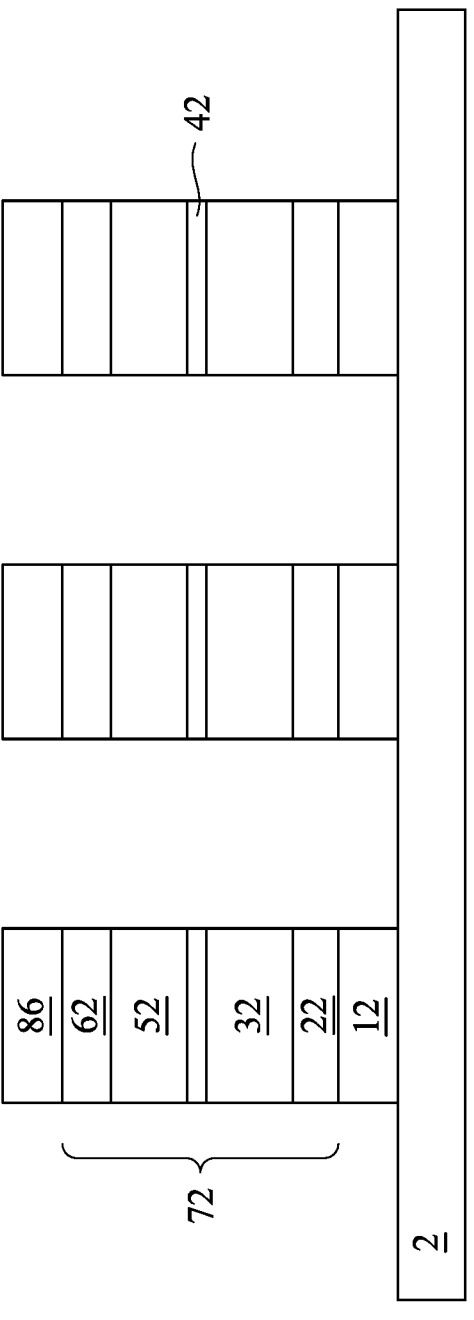
Figure 12B:
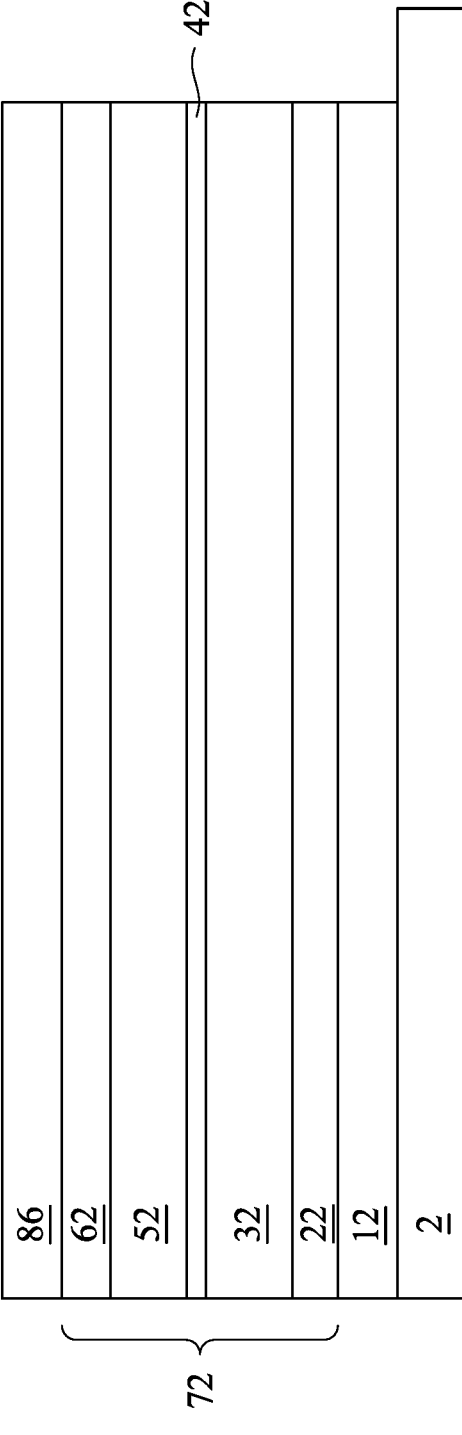

In FIGS. 11, 12A, and 12B, the pattern of the photomask 88 is used to pattern the hard mask layer 84, thereby forming hard mask 86. The hard mask 86 is then used as a mask to etch each of the layers of the memory stack layers 70 in turn followed by the bitline layer 10. The etching processes used to etch each of the layers may using etching techniques suitable for the material of each of the layers being etched. For example, in some embodiments dry etching is used to etch each of the layers using suitable etchants. In other embodiments, reactive ion etching may be used. In other embodiments, wet etching may be used using suitable etchants. In other embodiments, a combination of etching techniques is used. As a result of the etching, bitline layer 10 is altered into the bit lines 12, the bottom electrode layer 20 is altered into the bottom electrode layers 22, the memory structure layers 30 are altered into the memory structure layers 32, the interfacial layer 40 is altered into the interfacial layers 42, the selector structure layers 50 are altered into the selector structure layers 52, the top electrode layer 60 is altered into the top electrode layers 62, and together the memory stack layers 70 are altered into the memory stack layers 72. Following the patterning of the memory stack layers 70, the memory cells 200 are partially etched, being separated into rows according to the rows in which the memory cells 200 align.

Figure 13:
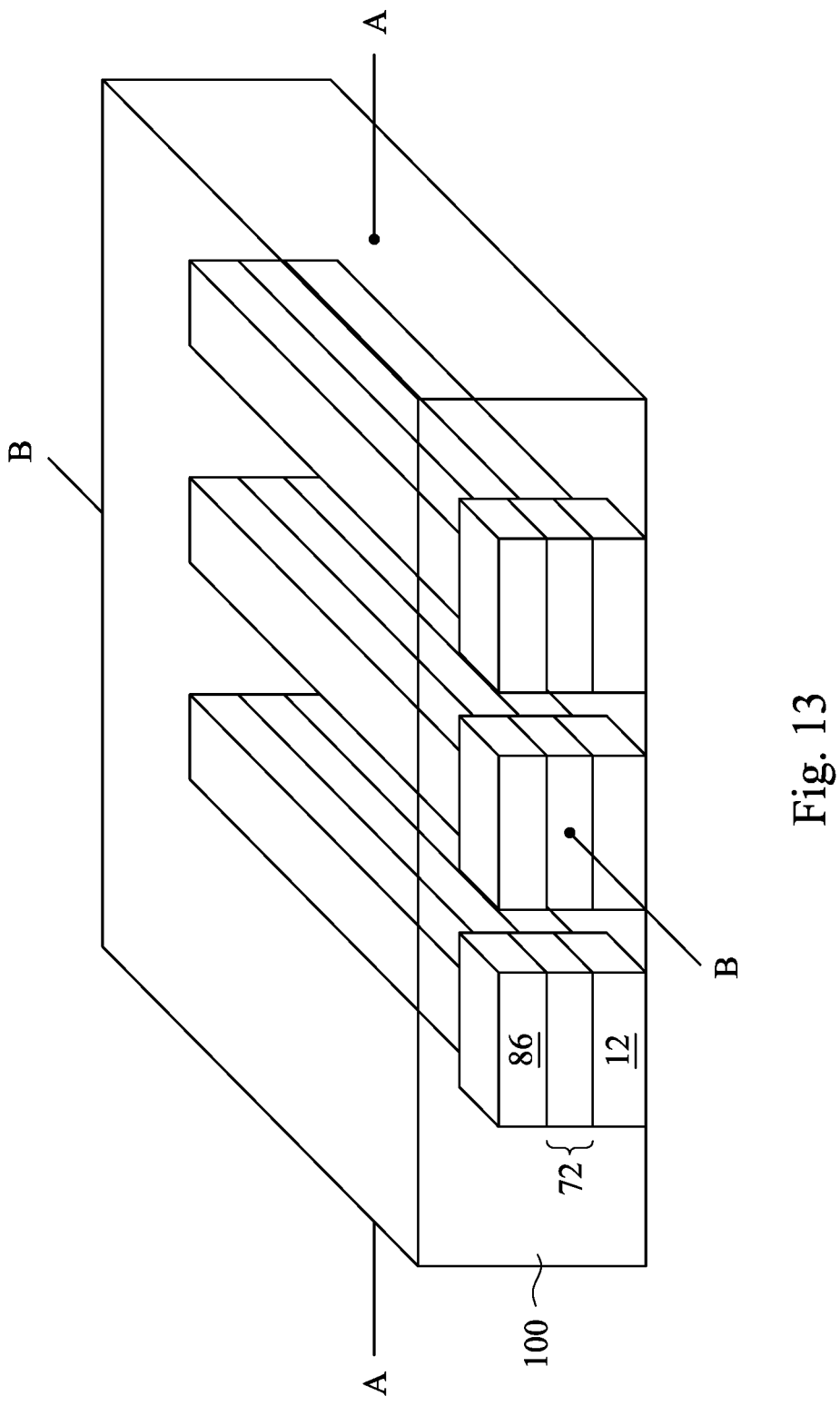
Figure 14A:
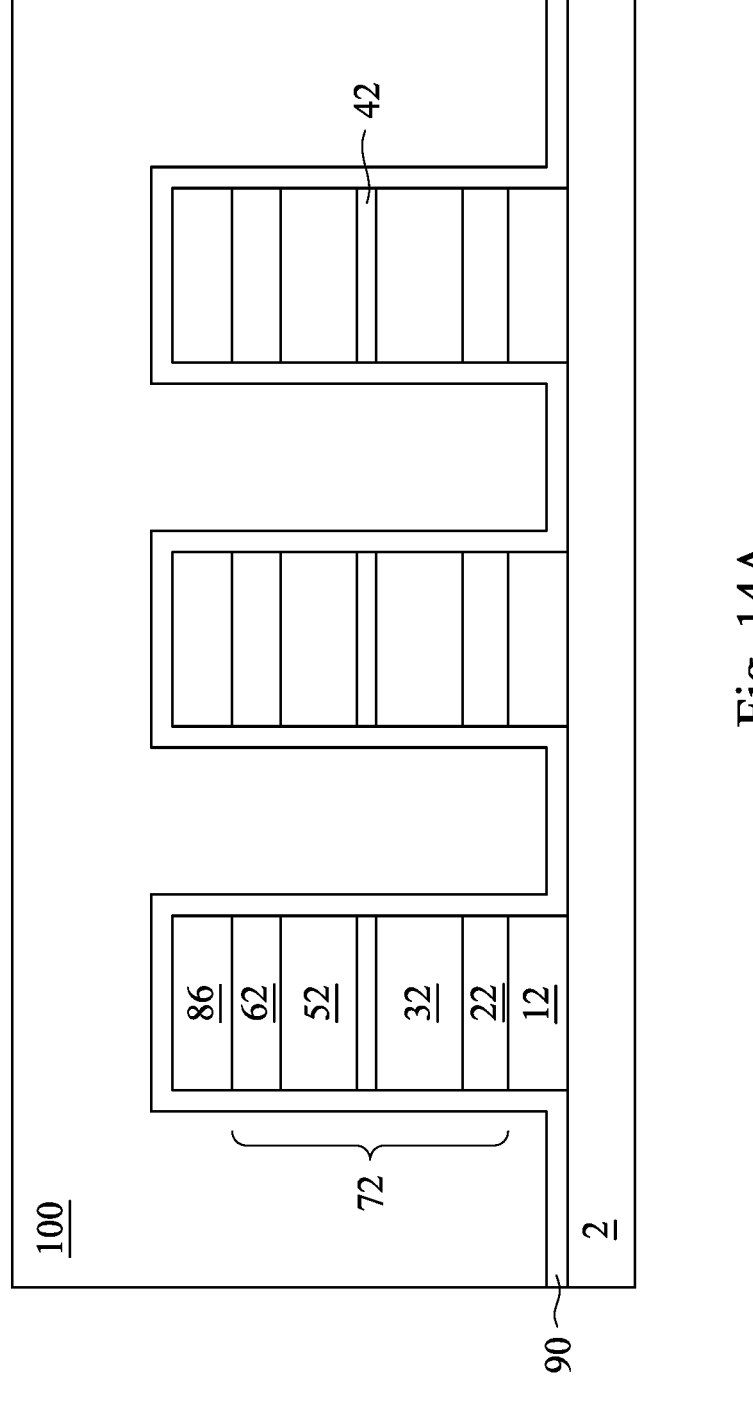
Figure 14B:
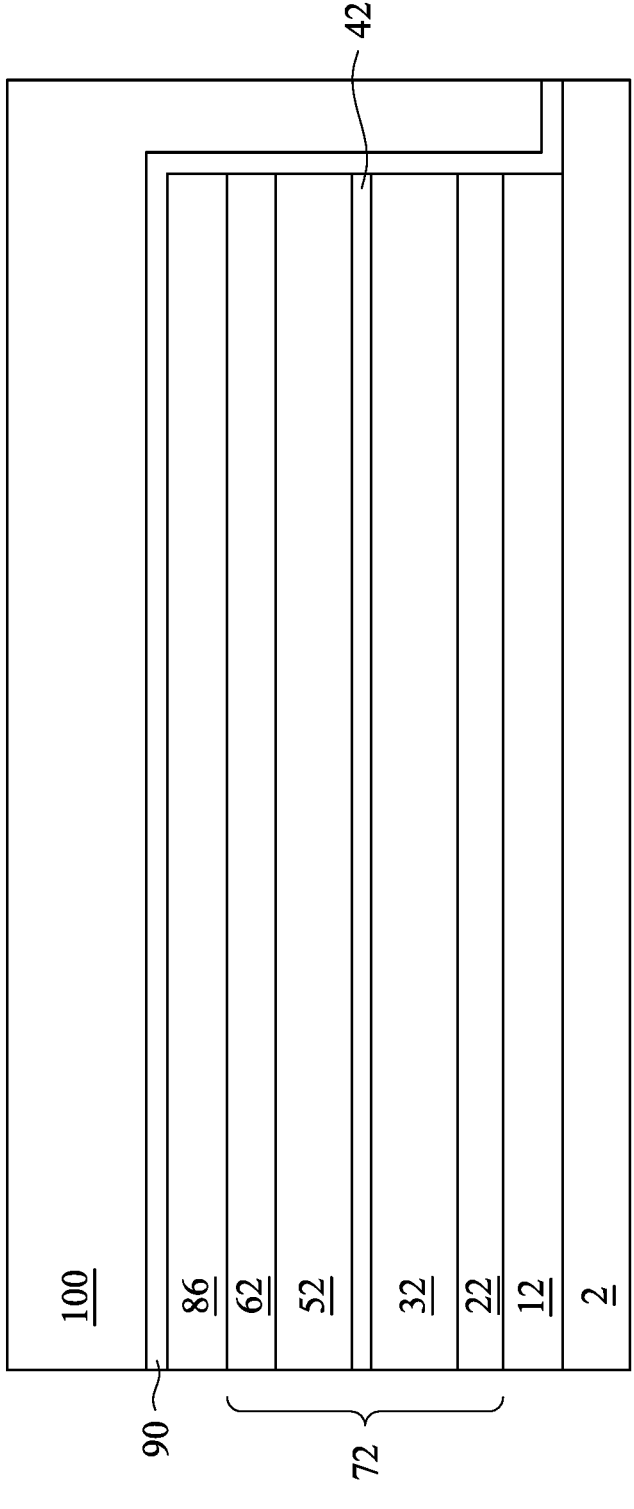

In FIGS. 13, 14A, and 14B, a protection layer 90 may be conformally formed over the patterned memory stack layers 72 and a dielectric fill 100 deposited laterally surrounding and encapsulating the memory stack layers 72. The protection layer 90 may include any suitable insulating material. In some embodiments, the protection layer 90 may include an extremely low-k material, for example, having a k value lower than about 4.0. In some embodiments, the protection layer 90 may include a multi-layer structure, including the extremely low-k material and a capping layer to help protect the low-k material. For example, in some embodiments, the low-k material may include silicon oxycarbonitride or silicon oxynitride and the capping layer may include silicon carbide or silicon nitride. These are merely examples; other suitable materials may be utilized instead. The dielectric fill 100 may be formed using any suitable insulating material by any suitable process. In some embodiments, the dielectric fill 100 may be silicon oxide or an insulating polymer. The dielectric fill 100 may be formed using any suitable process, such by spin-on, CVD, PVD, and the like, or combinations thereof. When the dielectric fill 100 includes silicon oxide, it may also be formed by a tetraethyl orthosilicate (TEOS) deposition process.

Figure 15:
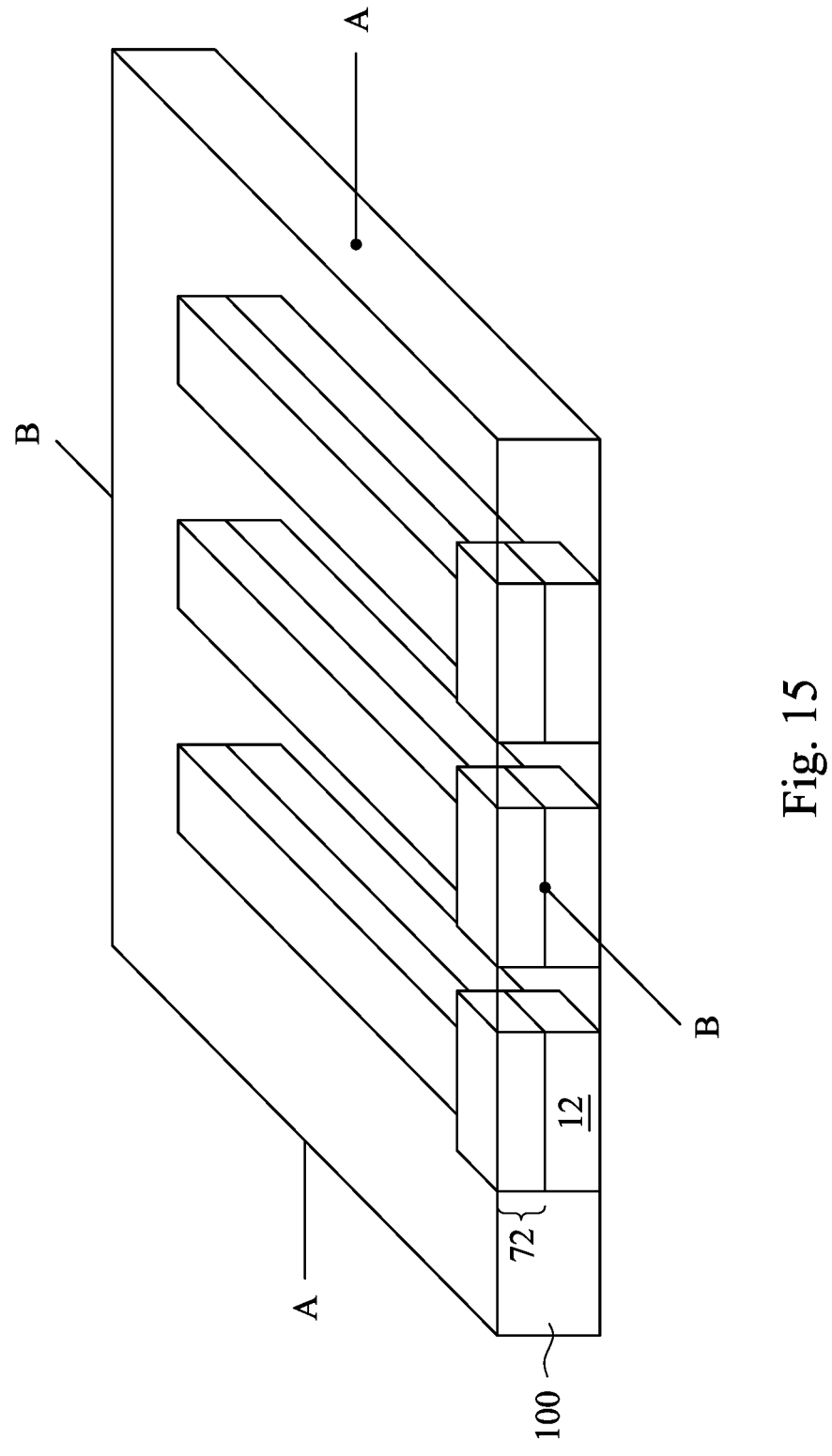
Figure 16A:
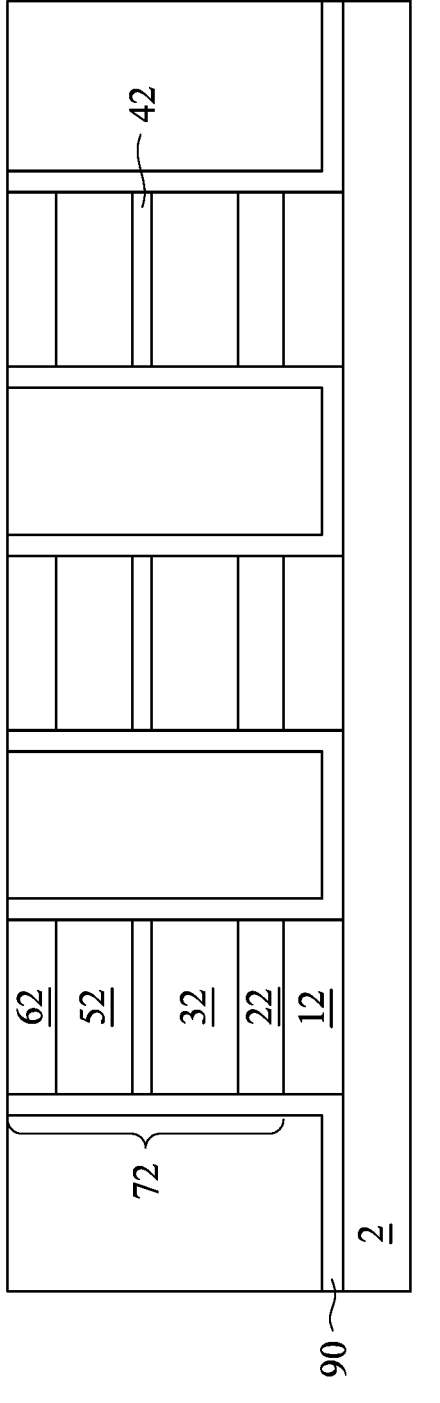
Figure 16B:
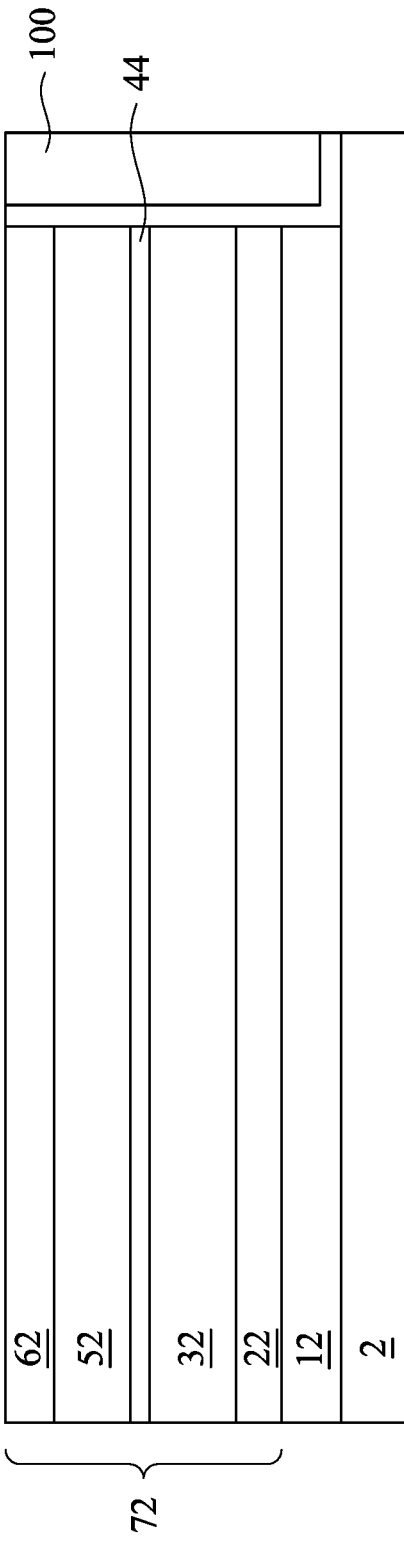

In FIGS. 15, 16A, and 16B, a planarization process, such as a chemical mechanical polishing (CMP) process is used to level an upper surface of the dielectric fill 100 with the upper surface of the top electrode layer 62.

Figure 17:
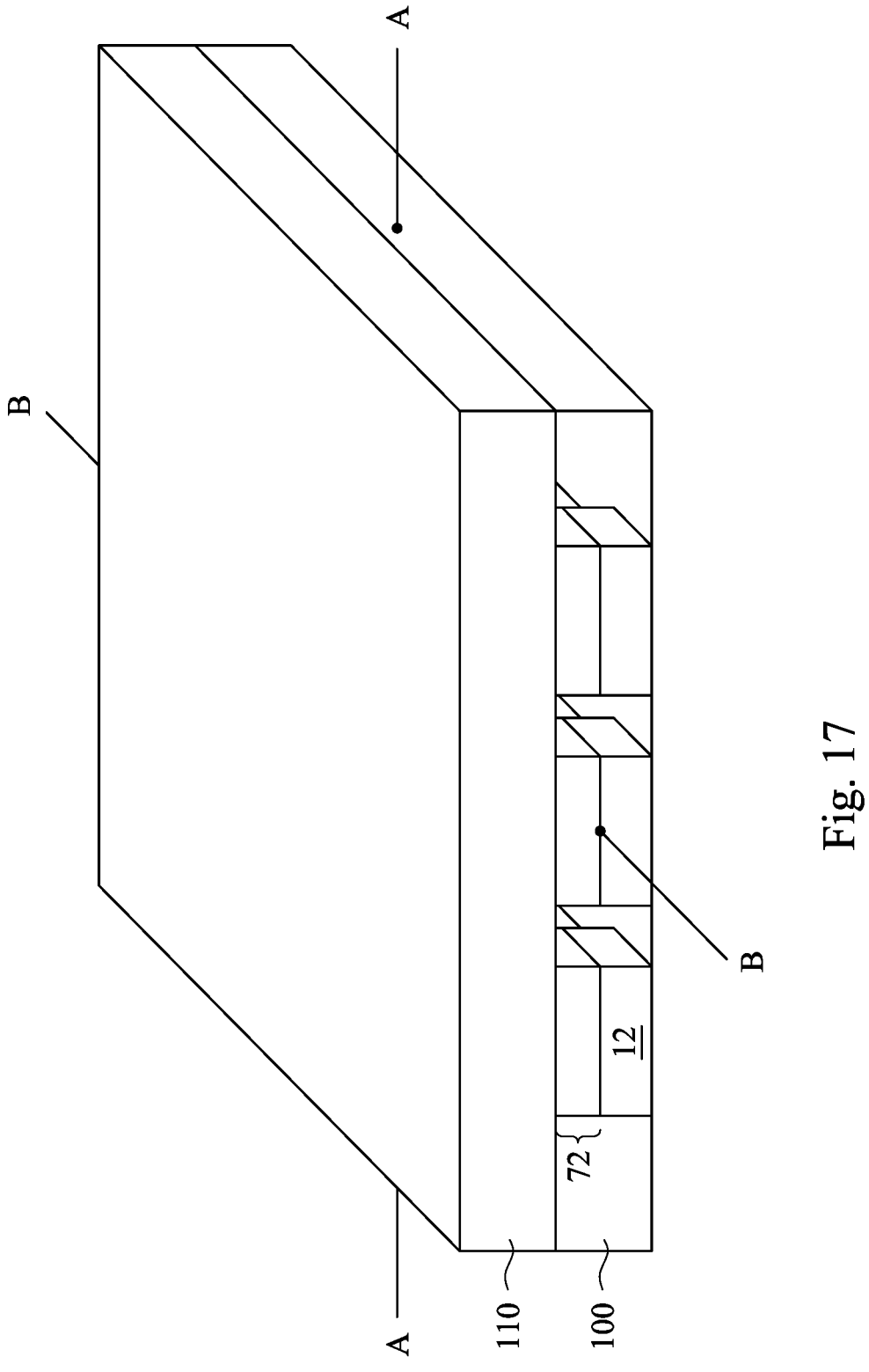
Figure 18A:
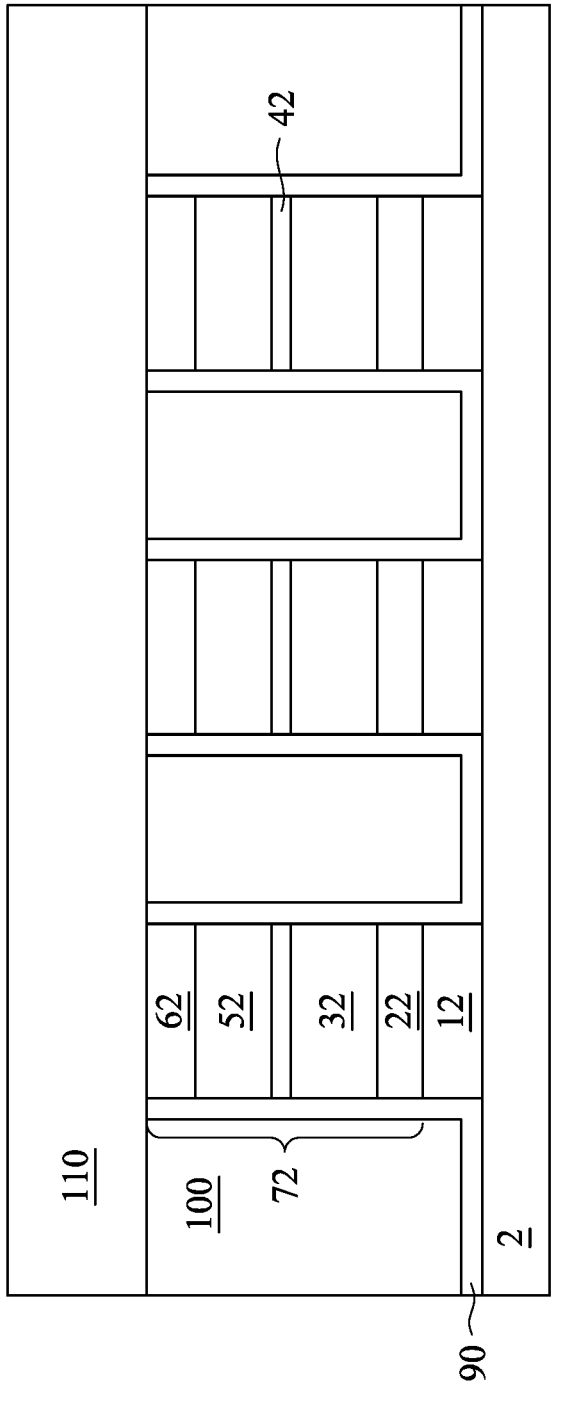
Figure 18B:
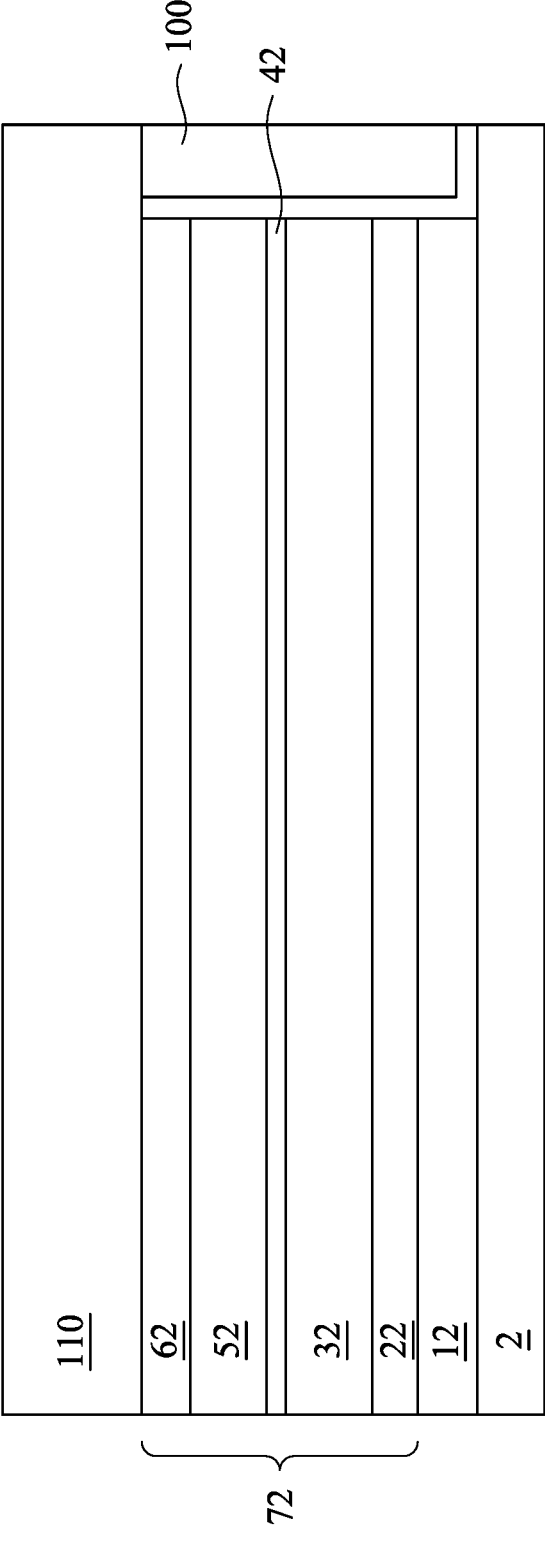

In FIGS. 17, 18A, and 18B, a word line layer 110 may be blanket deposited over the dielectric fill 100 and the memory stack layers 72. The word line layer 110 may be formed using processes and materials similar to those used to form the bit line layer 10.

Figure 19:
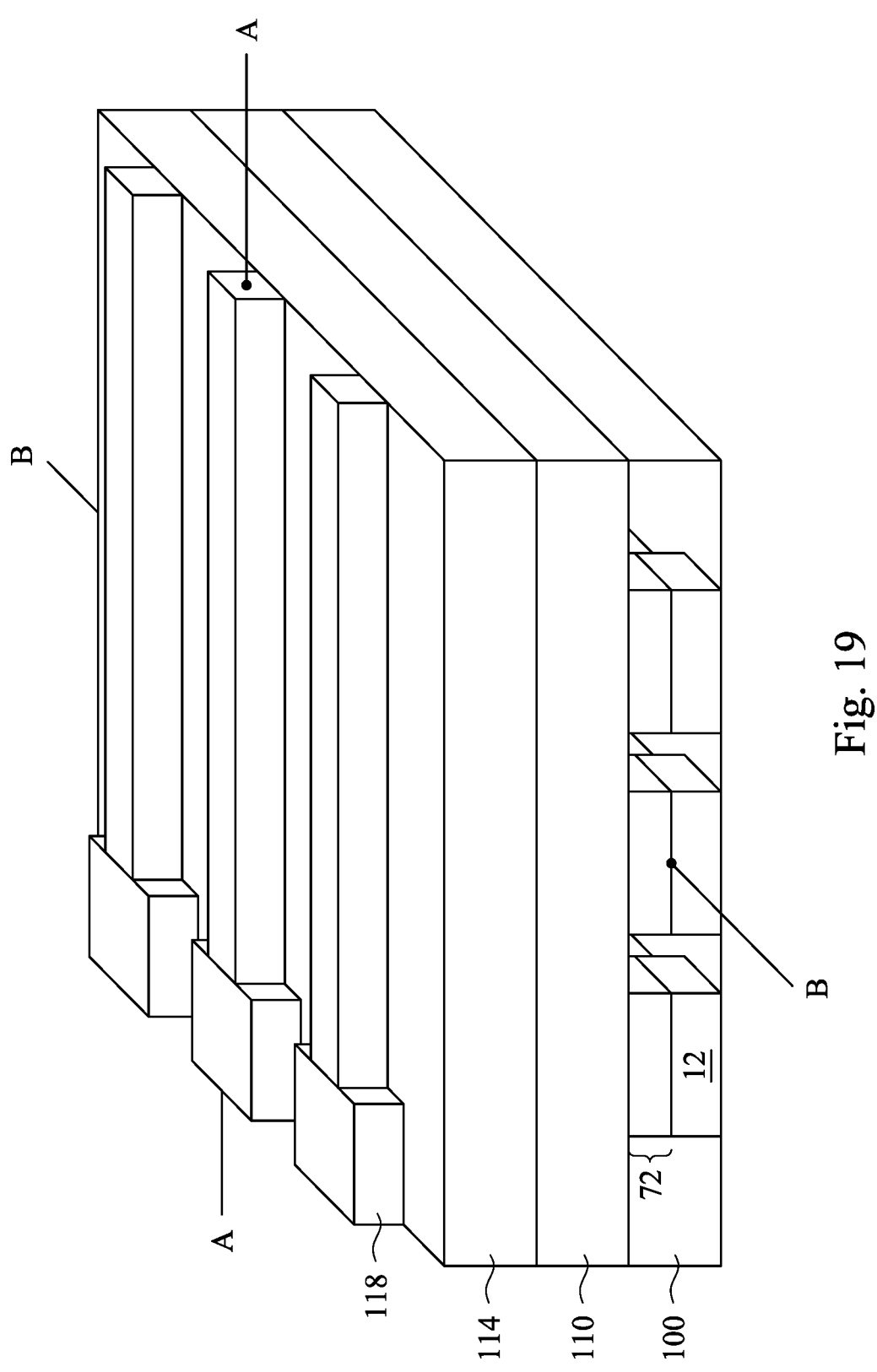
Figure 20A:
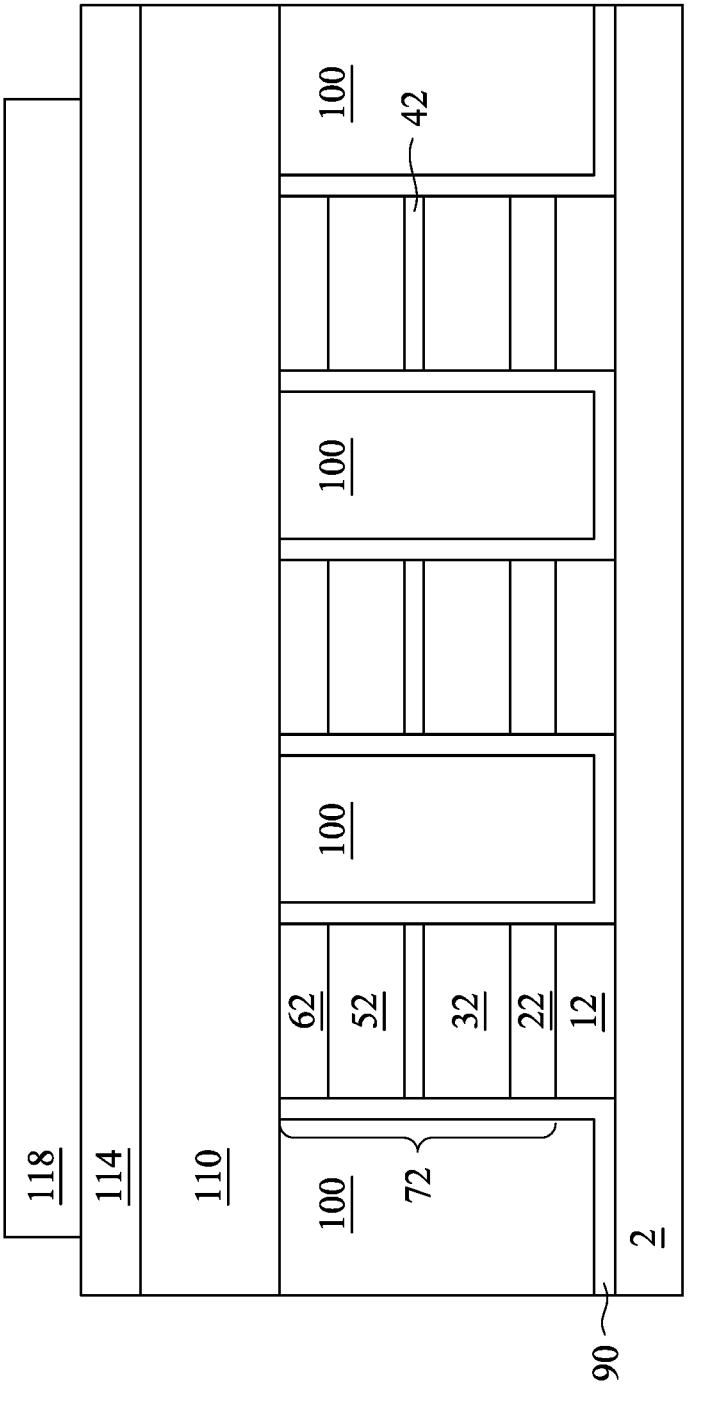
Figure 20B:
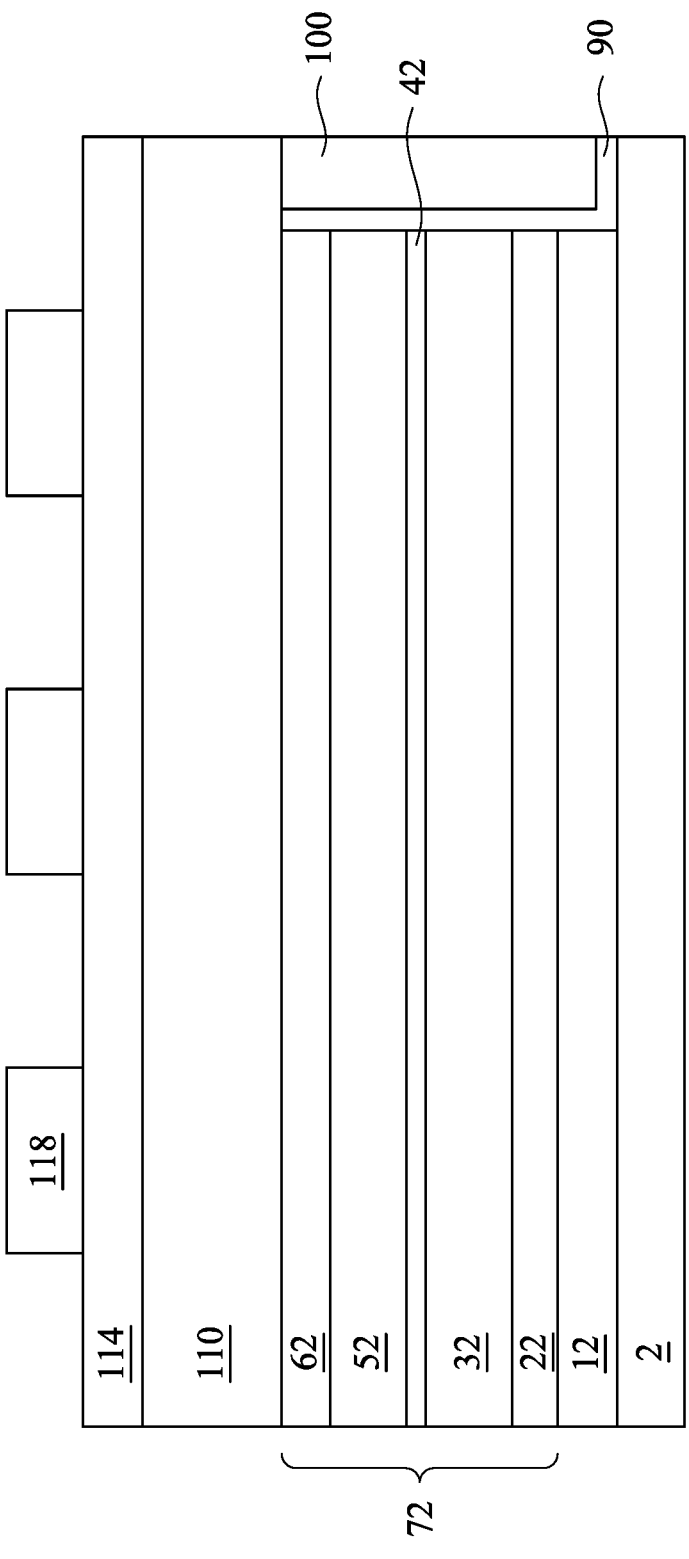

In FIGS. 19, 20A, and 20B, a hard mask layer 114 is formed over the word line layer 110. The hard mask layer 114 may be formed using processes and materials similar to those described above with respect to the hard mask layer 84. After the hard mask layer 114 is formed, a photomask 118 is deposited over the hard mask layer 114 and patterned using acceptable photopatterning techniques.

Figure 21:
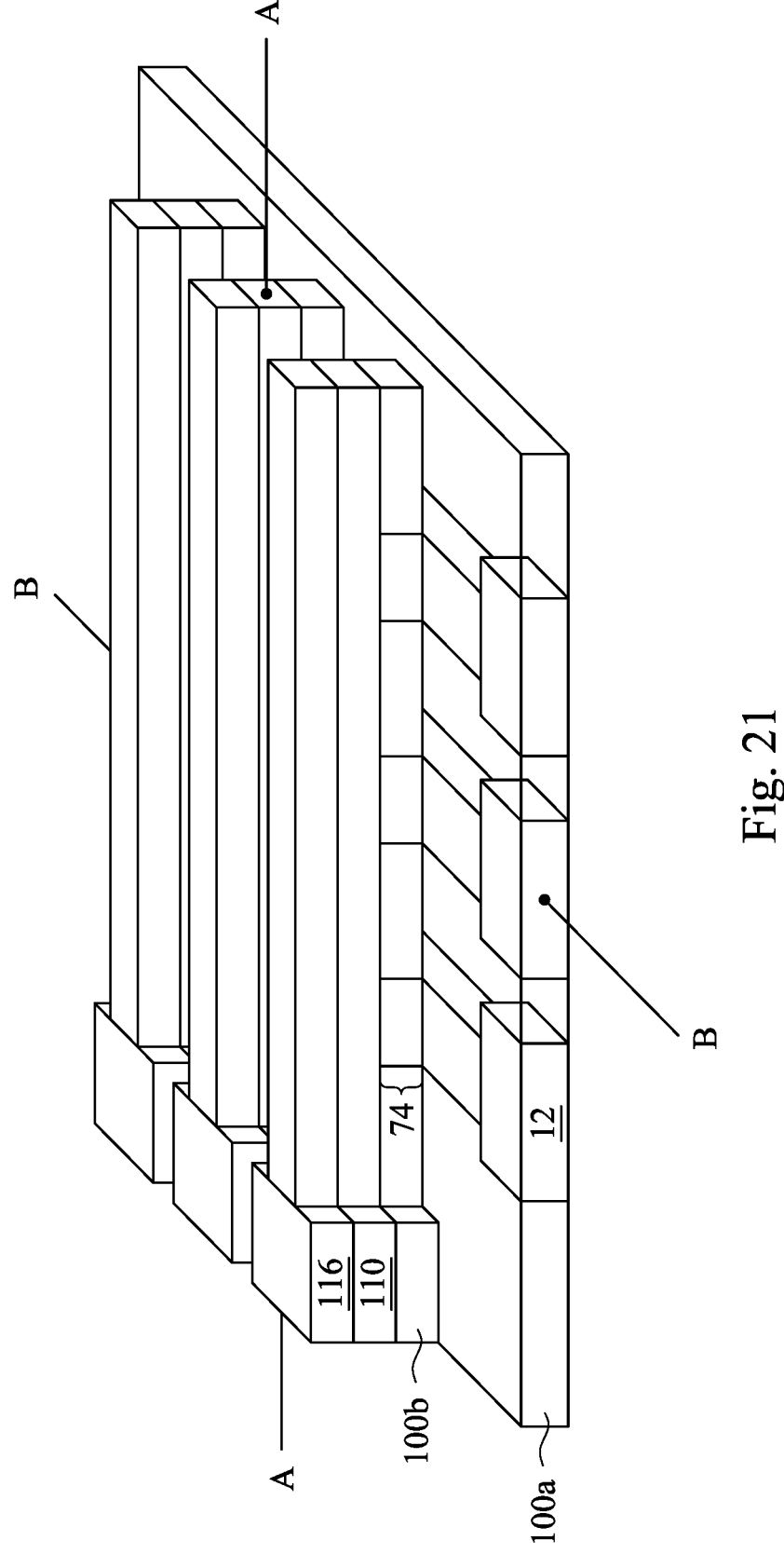
Figure 22A:
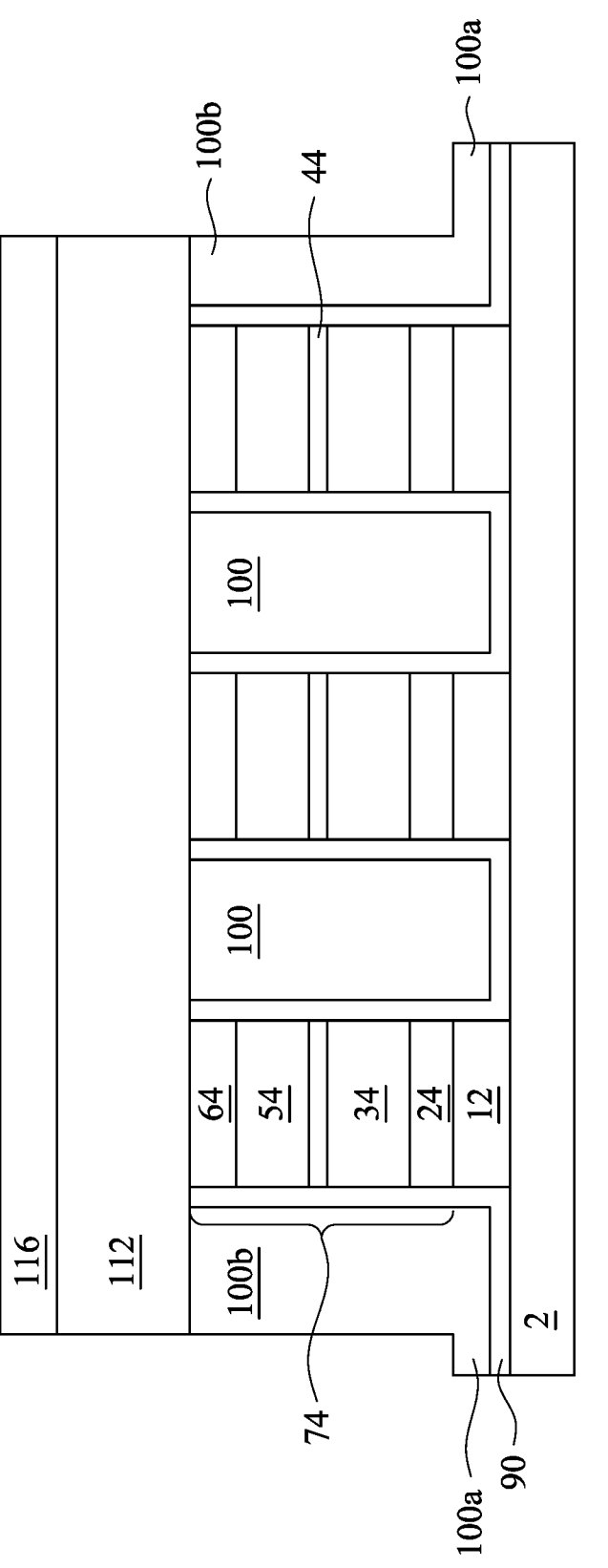
Figure 22B:
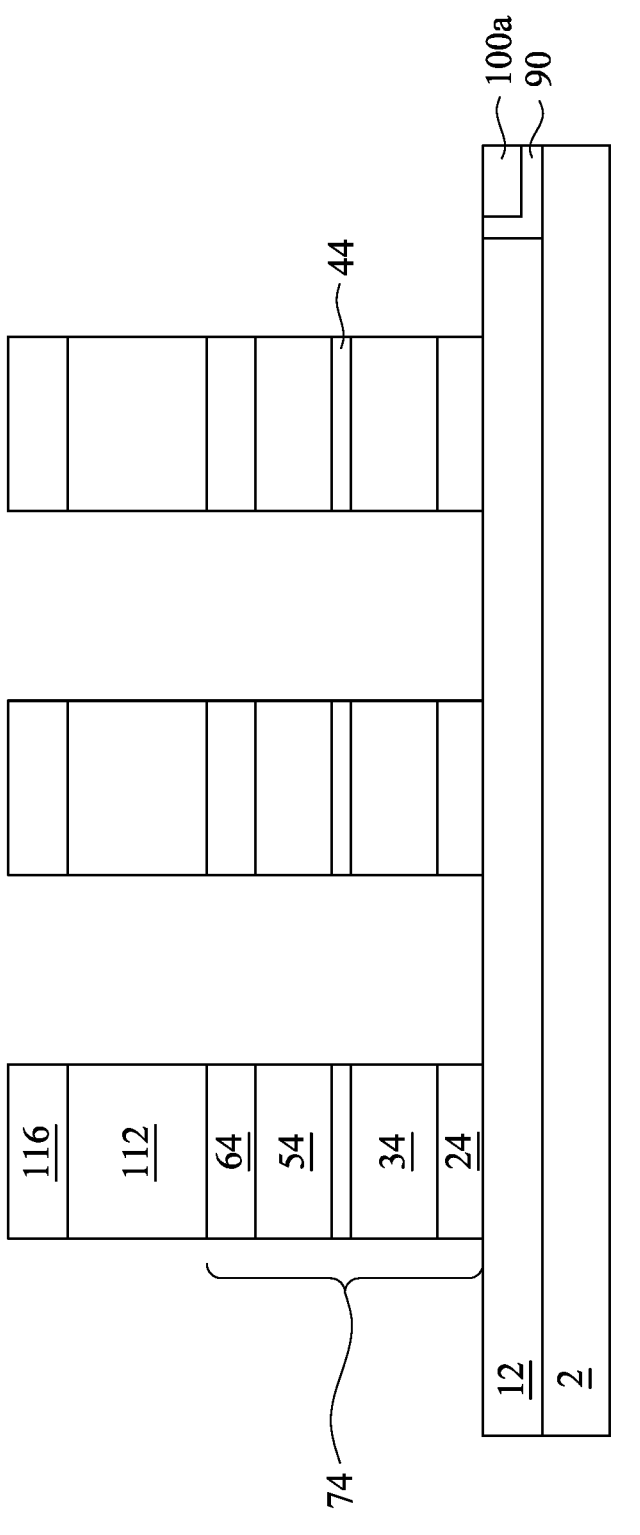

In FIGS. 21, 22A, and 22B, the pattern of the photomask 118 is used to pattern the hard mask layer 114, thereby forming hard mask 116. The hard mask 116 is then used as a mask to etch the word line layer 110 followed by each of the layers of the memory stack layers 72 in turn. The etching processes used to etch each of the layers may using etching techniques suitable for the material of each of the layers being etched. For example, in some embodiments dry etching is used to etch each of the layers using suitable etchants. In other embodiments, reactive ion etching may be used. In other embodiments, wet etching may be used using suitable etchants. In other embodiments, a combination of etching techniques is used. As a result of the etching, word line layer 110 is altered into the word lines 112, the top electrode layer 62 is altered into the top electrodes 64, the selector layers 52 are altered into the selector structure 54, the interfacial layer 42 is altered into the interfacial layers 44, the memory structure layers 32 are altered into the memory storage structure 34, the bottom electrode layers 22 are altered into the bottom electrodes 24, and together the memory stack layers 72 are altered into the pillars 74. Following the patterning of the pillars 74, the memory cells 200 have been fully etched. When the bitlines 12 were formed, the memory cells 200 were separated into rows and when the word lines 112 were etched, the memory cells 200 are further separated into columns, thereby forming the full memory cells 200, which include the memory elements 76 interposed between the top electrode 64 and bottom electrode 24 (see FIGS. 4A, 4B, 4C, and 4D).

In some embodiments, the exposed areas of the dielectric fill 100 may be completely removed by the etching processes of FIGS. 21, 22A, and 22B to form dielectric fill 100b, however, in some embodiments, a remnant 100a of the dielectric fill 100, with an upper surface approximately aligned to the upper surface of the bitlines 12 may remain behind following the etching processes.

Figure 23:
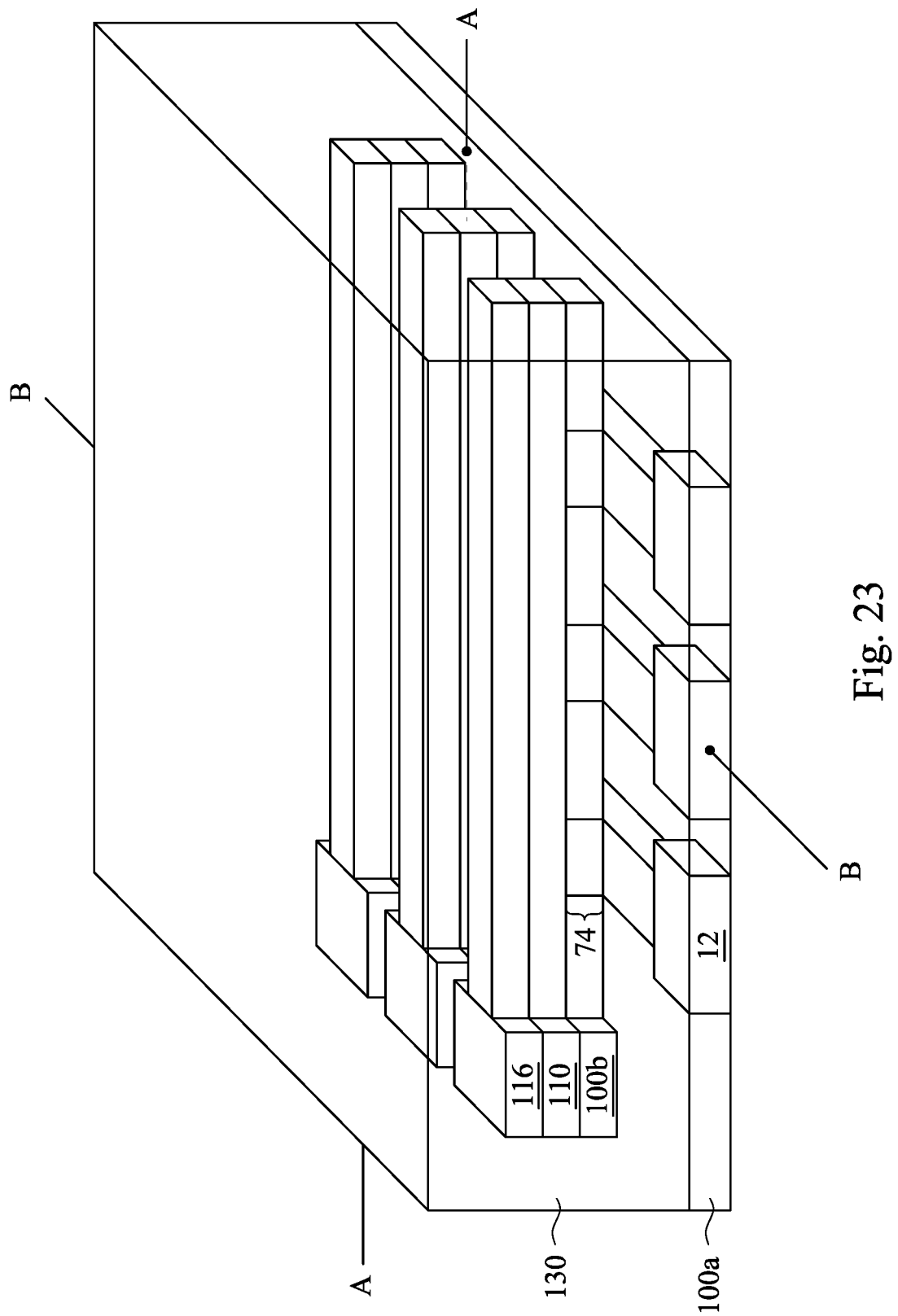
Figure 24A:
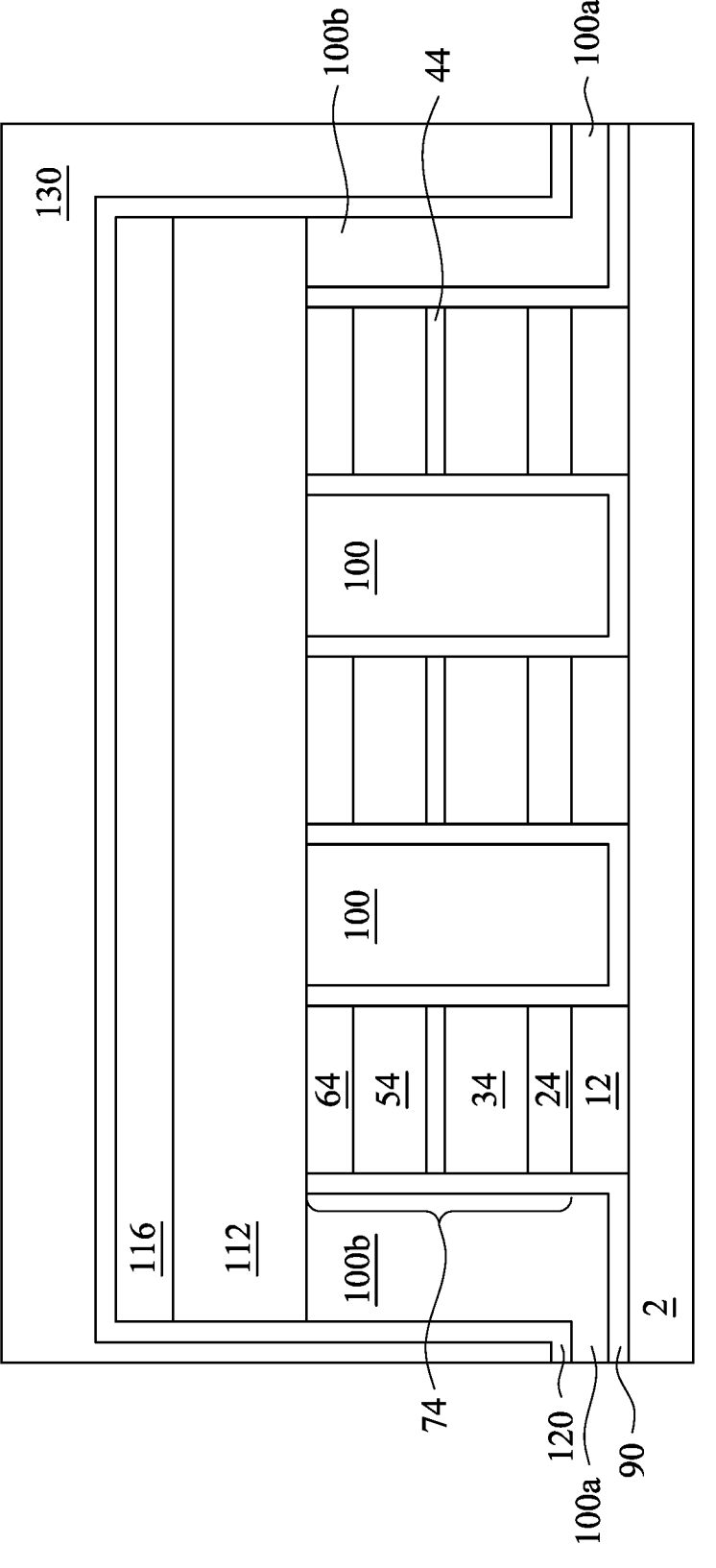
Figure 24B:
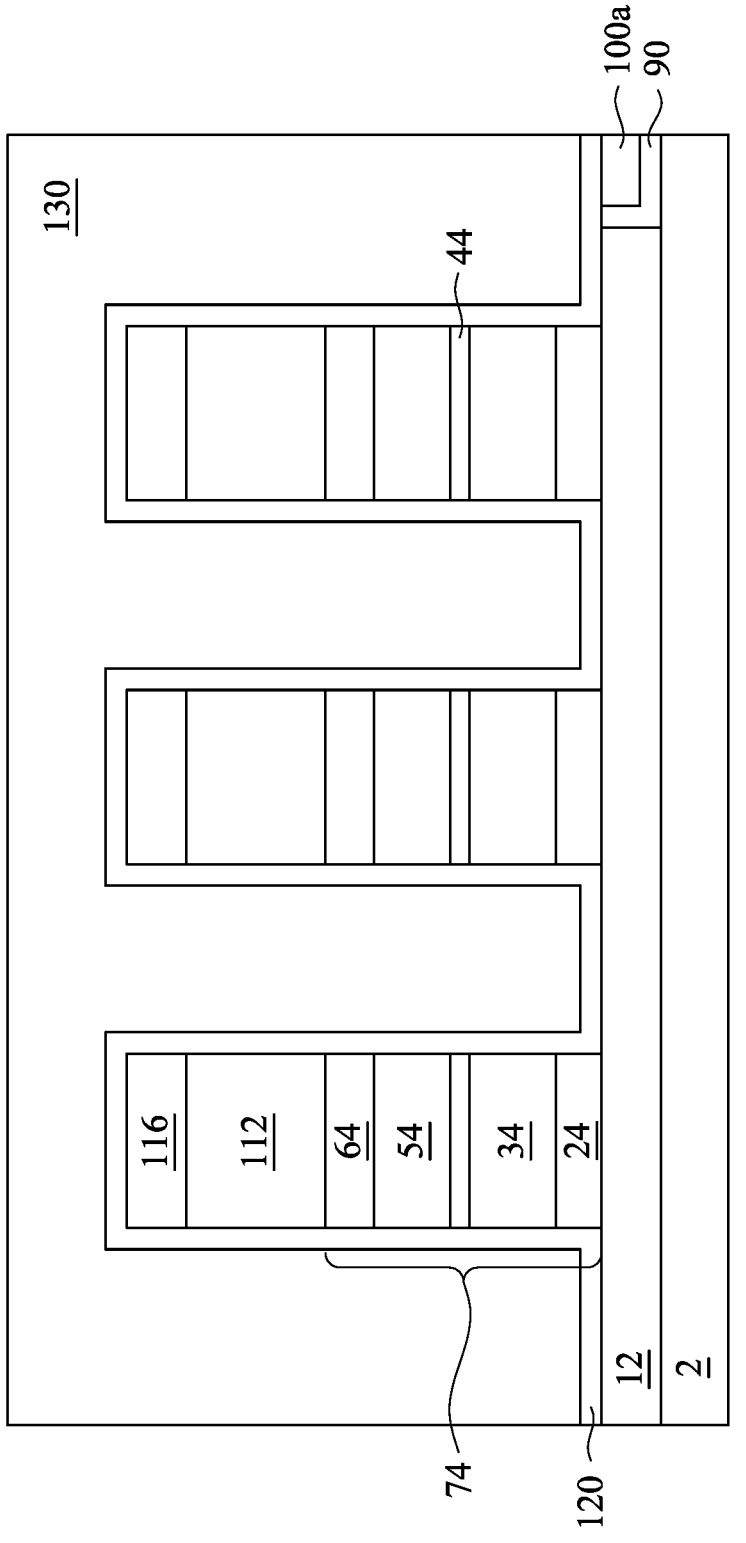

In FIGS. 23, 24A, and 24B, a protection layer 120 may be conformally formed over the patterned pillars 74 and a dielectric fill 130 deposited laterally surrounding and encapsulating the pillars 74. The protection layer 120 may be formed using processes and materials similar to those used to form the protection layer 90, and the dielectric fill 130 may be formed using processes and materials similar to those used to form the dielectric fill 100.

Following the patterning and formation of the protection layer 120, each of the pillars 74 is laterally encapsulated by a combination of the protection layer 90 and the protection layer 120. Further, each of the pillars 74 is laterally encapsulated by a combination of the dielectric fill 100 and the dielectric fill 130.

Figure 25:
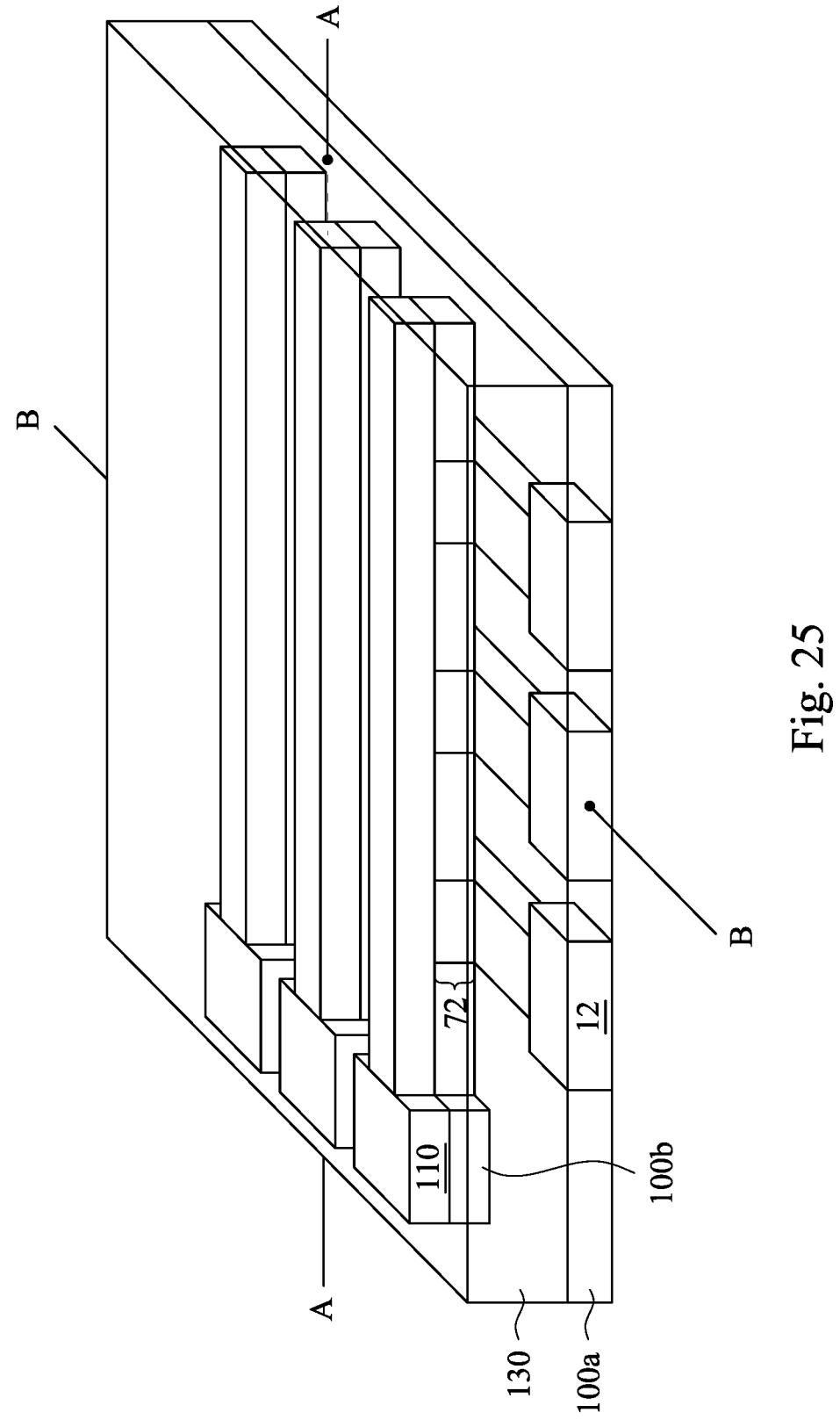
Figure 26A:
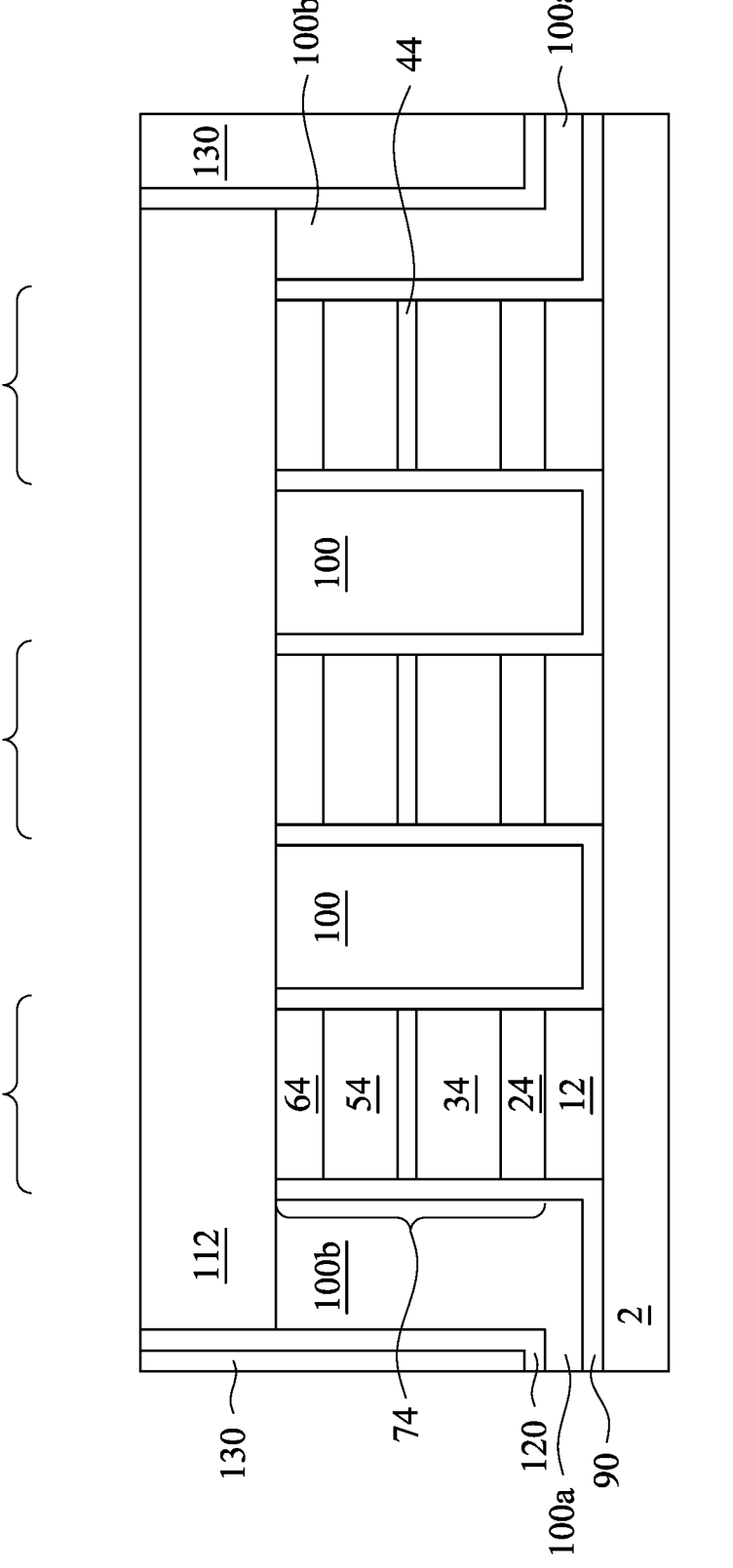
Figure 26B:
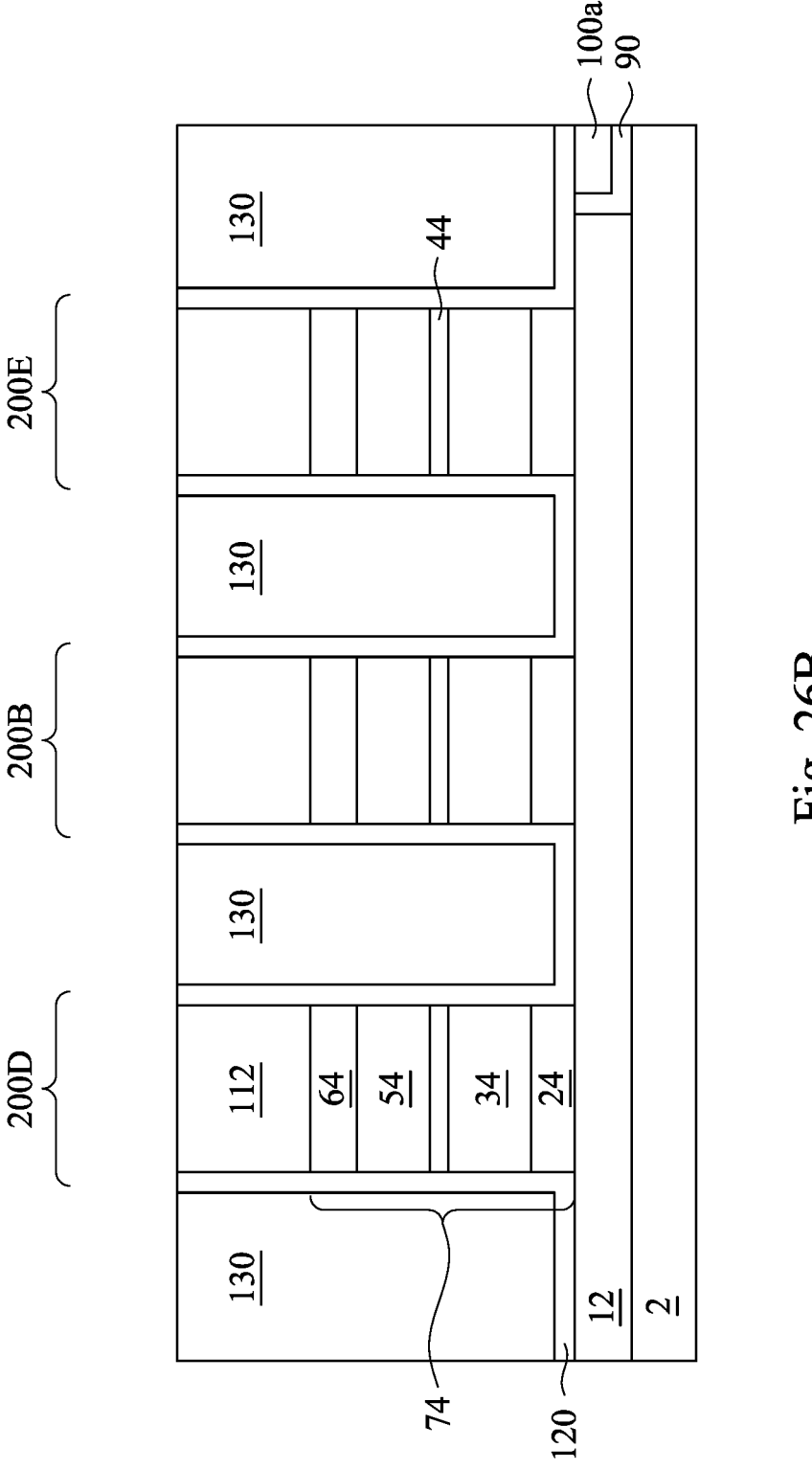

In FIGS. 25, 26A, and 26B, a planarization process, such as a chemical mechanical polishing (CMP) process is used to level an upper surface of the dielectric fill 130 with the upper surface of the top electrode layer 64. Thus, the memory cells 200 are formed, including for example, the memory cell 200A, 200B, 200C, 200D, and 200E, such as illustrated in FIGS. 25, 26A, and 26B.

It should be appreciated that other processes may be used to form the memory cells. For example, the bitlines 12 may be formed within a dielectric layer (e.g., 100a), the bitlines 12 leveled with the dielectric layer. Then, each of the memory stack layers 70 formed. Then, each of the memory stack layers 70 may be patterned to form pillars 74. The pillars 74 may then be covered by a protection layer, such as the protection layer 90 or protection layer 120. Then, the pillars 74 may be laterally encapsulated with a dielectric fill, such as the dielectric fill 100 or the dielectric fill 130. Next, the dielectric fill may be planarized and leveled to the tops of the pillars 74 and then the word lines 112 may be formed.

Figure 27A:
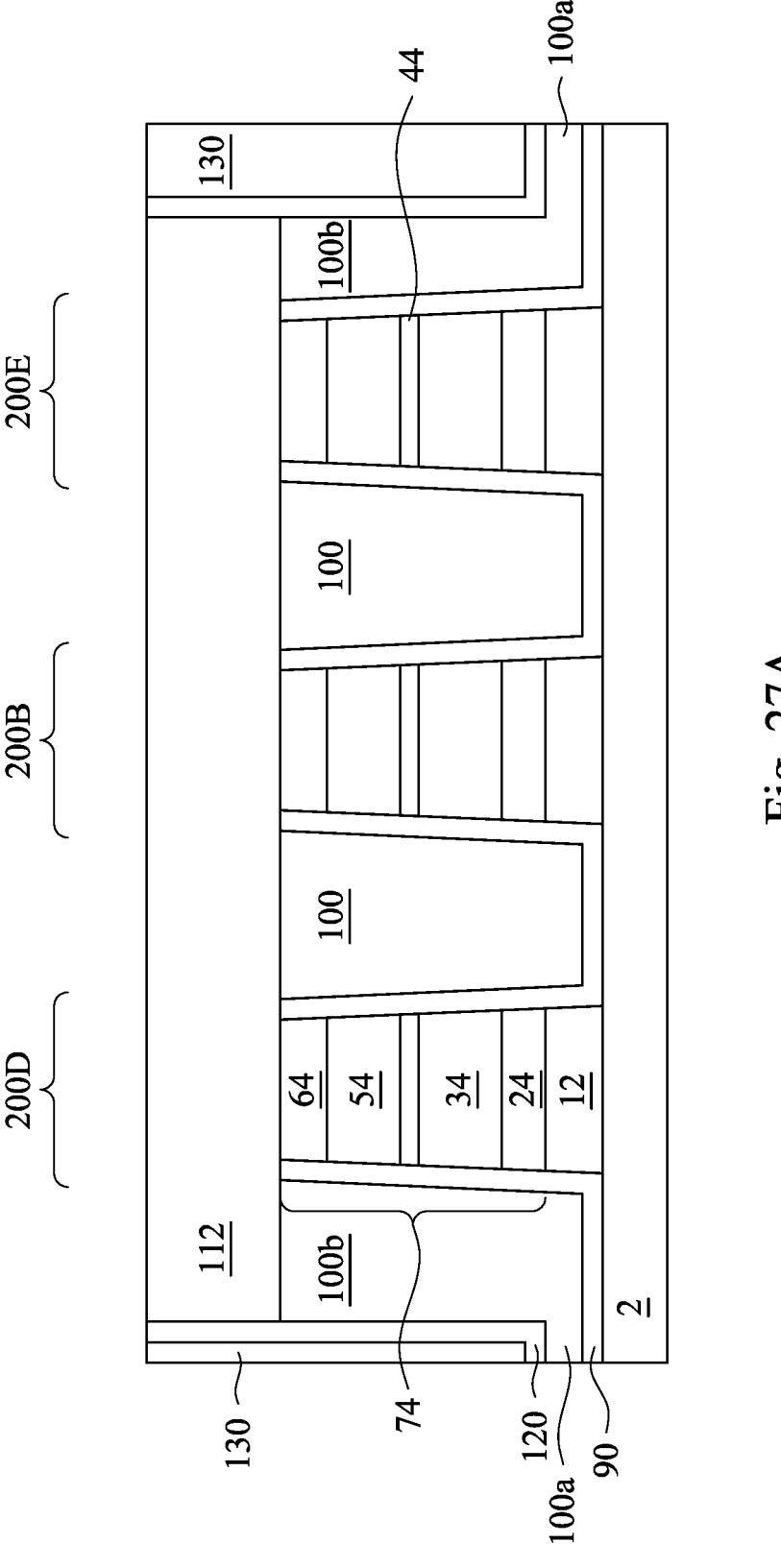
FIGS. 27A and 27B illustrate various configurations, in accordance with some embodiments.
Figure 27B:
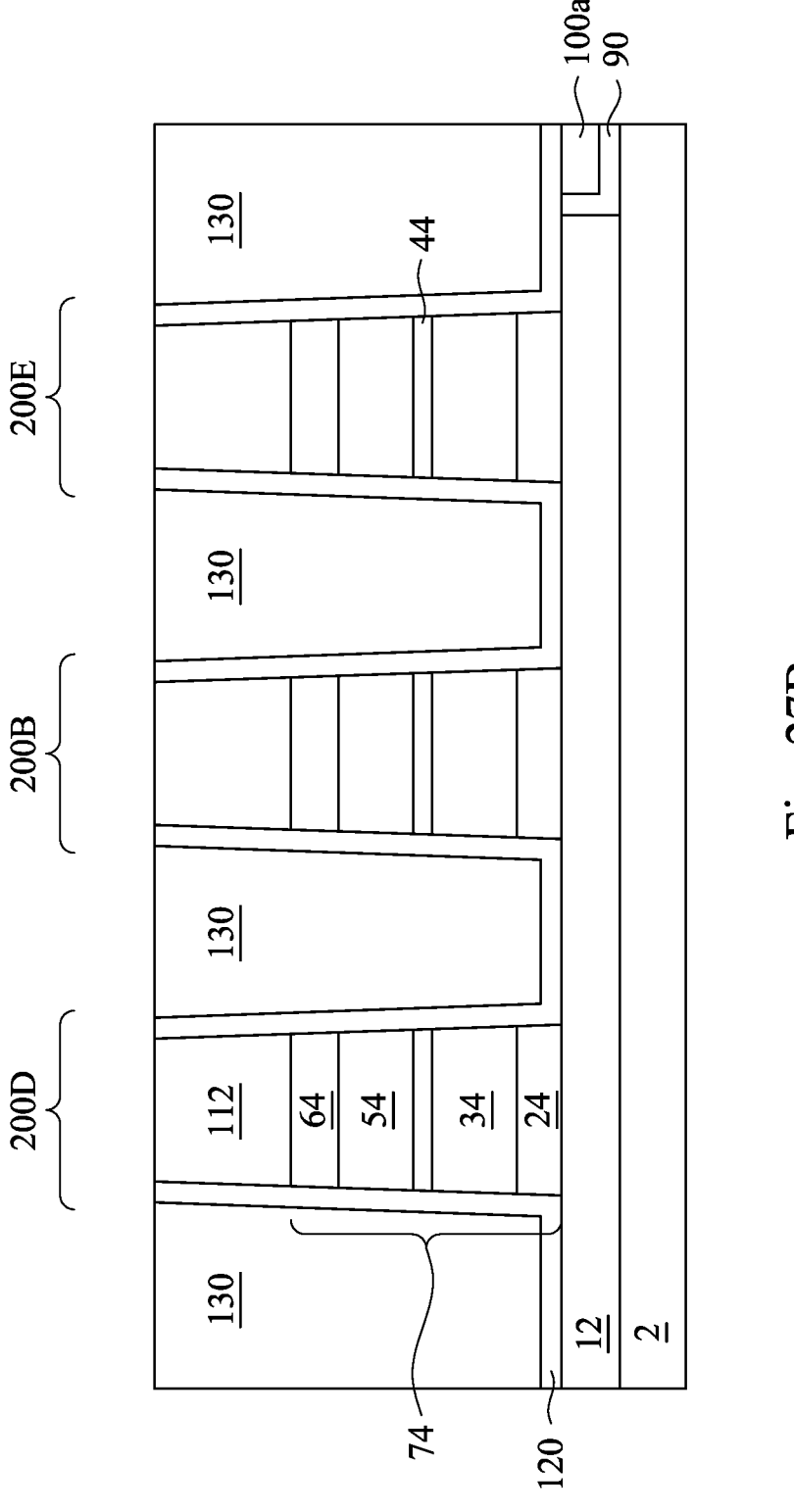

In FIGS. 27A and 27B, the same structure of FIGS. 26A and 26B is illustrated, except that the pillars 74 are illustrated as having sloping or tapered sidewalls. In some embodiments, the pillars 74 may be different shapes, such as illustrated in FIGS. 4A, 4B, 4C, and 4D. In FIGS. 27A and 27B, when the layers (the bottom electrode 24, the memory storage structure 34, the interfacial layer 44, the selector structure 54, and the top electrode 64) are etched from which the pillars are formed, the etching may produce sidewalls which are not vertical. In some embodiments, the sidewalls may be tapered outwardly, such as illustrated in FIGS. 27A and 27B, while in other embodiments, the sidewalls may be tapered inwardly, for example by flipping the shapes of the pillars 74. These variations may be substituted in the other illustrations, but for the sake of simplicity are not separately illustrated otherwise.

Figure 28:
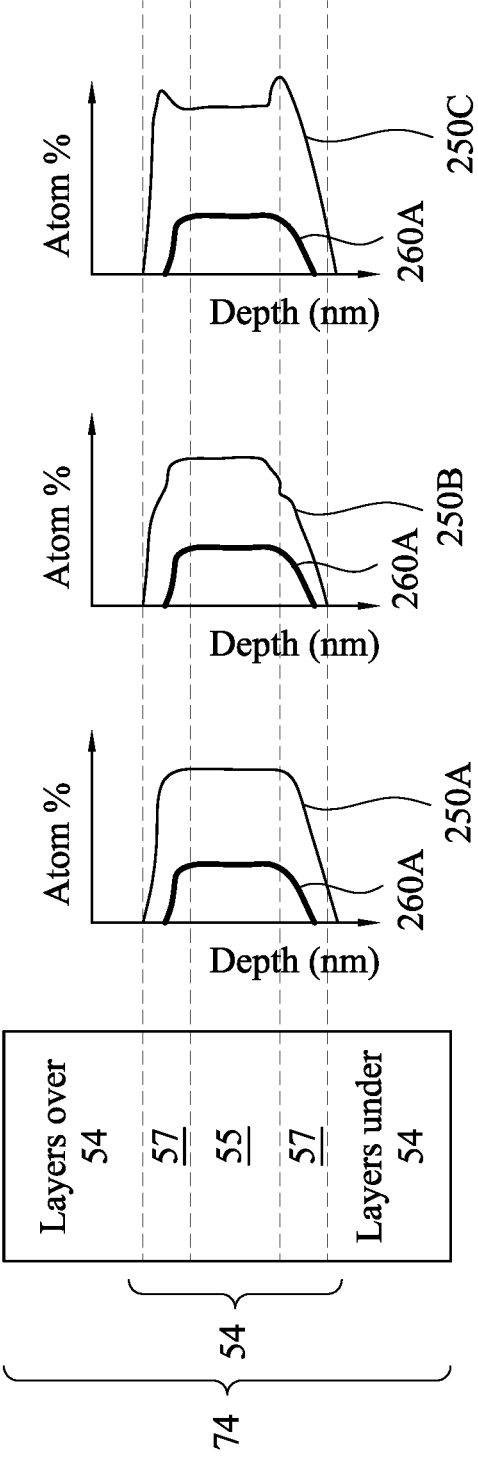
FIGS. 28 and 29 illustrate concentration profiles, in accordance with some embodiments.
Figure 29:
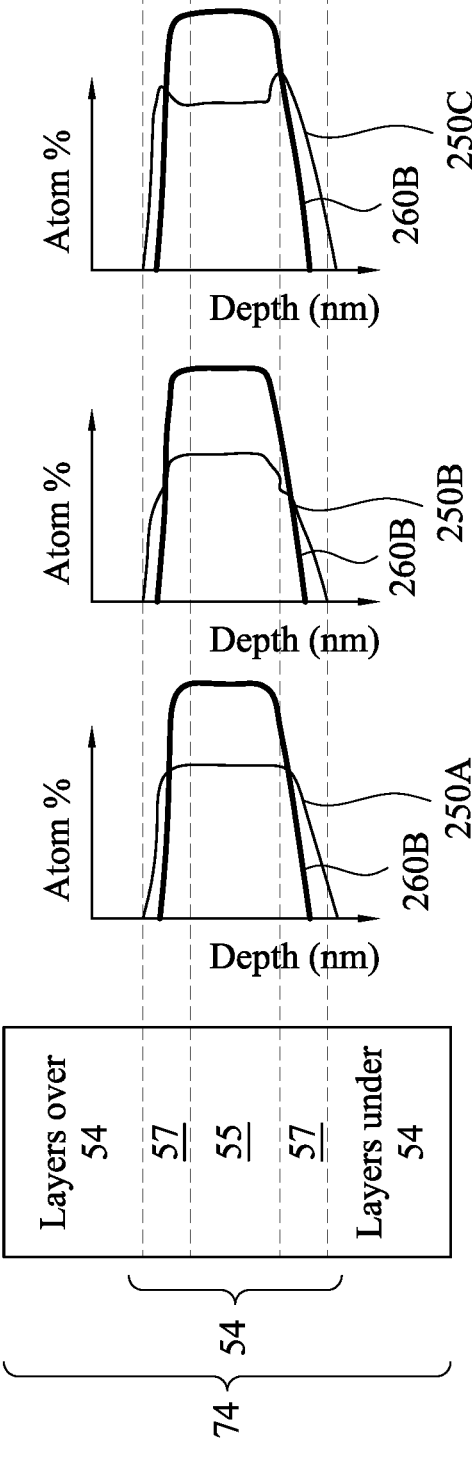

FIGS. 28 and 29 illustrate several variations on the gradient profiles of the first OTS material layer 55 and second OTS material layer 57. To the left of each figure is a representation of the selector structure 54 including the layout from FIG. 8A, with a first OTS material layer 55 sandwiched between two second OTS selector layers 57. These are part of the pillar 74 which includes the layers over the selector structure 54 and the layers under the selector structure 54. These over and under layers may vary based on the layout, such as described above with respect to FIGS. 5A, 5B, 5C, and 5D.

To the right of each figure includes graphs with one axis being the depth profile for the selector structure 54 and the other axis being the atomic percentage concentration of materials in the selector structure 54. The layer-to-layer demarcation between the first OTS material layer 55 and the second OTS material layers 57 have been extended from the left hand side through the graphs.

The lines labeled 250A, 250B, and 250C represent atomic percent concentration of the elements shared with both the first OTS material layer 55 and the second OTS material layer 57. The lines labeled 260A and 260B represent the atomic percentage concentration of the elements specific to the just the first OTS material layer 55. As described above, the first OTS material layer 55 includes a subset of elements in common with the second OTS material layer 57 (and third OTS material layer 59) as well as additional elements specific to the first OTS material layer 55.

In FIG. 28, the shared elements have a higher concentration than the non-shared elements. As such, the percent concentration of the shared elements is greater than the percent concentration of the elements specific to the first OTS material layer 55. In FIG. 29, the elements specific to the first OTS material layer 55 have a higher percent concentration than the shared elements. As such, the percent concentration of the specific elements is illustrated as being greater in the first OTS material layer 55 than in the second OTS material layer 57.

In FIG. 28, the line 250A of the first graph illustrates that the shared elements in the first OTS selector layer 55 and second OTS material layer 57 has a gradual increase through the lower second OTS material layer 57 to the first OTS s material layer 55, where the concentration flattens and is consistent through the thickness of the first OTS material layer 55. Then, the shared elements have another gradual decrease now through the upper second OTS material layer 57. The line 250B of the second graph illustrates that the shared elements in the first OTS material layer 55 and second OTS material layer 57 has a two-slope increase through the lower second OTS material layer 57 and into the first OTS material layer 55. The concentration flattens and is consistent through the thickness of the first OTS material layer 55. Then, the shared elements have another two-slope decrease through the third OTS material layer 57. The line 250C of the third graph illustrates that the shared elements in the first OTS material layer 55 and second OTS material layer 57 has an increase through the lower second OTS material layer 57 and into the first OTS material layer 55. Then, the shared elements decrease into the first OTS material layer 55. The concentration then flattens and is consistent through the thickness of the first OTS material layer 55. Then, the shared elements have an increase into the upper second OTS material layer 57 followed by a decrease through the remaining portion of the upper second OTS material layer 57.

The lines 260A of each of the first, second, and third graphs of FIG. 28 illustrate that the elements specific to the first OTS material layer 55 may actually gradually increase through a thickness of the lower second OTS material layer 57. For example, after deposition, the elements specific to the first OTS material layer 55 may diffuse back into the adjoining second OTS material layers 57. For the thickness of the first OTS layer 55, the concentration of the specific elements may be substantially steady. Then, for the upper second OTS layer 57, the concentration of the specific elements (line 260A) may decrease through a thickness of the upper second OTS layer 57.

In FIG. 29, for the lines 250A, 250B, and 250C, the concentrations of the shared elements may have properties and characteristics similar to those discussed above with respect to FIG. 28. The lines 260B have concentration characteristics similar to the lines 260A, except that the concentrations of the elements specific to the first OTS switching layer 55 are greater than the concentrations of the shared elements between the first OTS switching layer 55 and second OTS switching layer 57.

FIGS. 28 and 29 illustrate where the second OTS switching layer 57 is used above and below the first OTS switching layer 55. In some embodiments, the third OTS switching layer 59 may be used above or below the first OTS switching layer. In such embodiments, the concentration curves may be the same as presented in FIGS. 28 and 29, though the second OTS switching layer 57 and third OTS switching layer 59 each have elements which are common to the first switching layer 55, but not common to each other. In some embodiments, the second OTS switching layer 57 over or under the first OTS switching layer 55 may not be used. In such embodiments, the illustrated curves include the concentration gradients for the side/interface between the first OTS switching layer 55 and the second OTS switching layer 57. The curves on the side of the first OTS switching layer 57. The curves on the side of the first OTS switching layer 55 opposite the second OTS switching layer 57 are similar to those depicted but compressed. In such embodiments, the materials of the first OTS switching layer 55 diffuse to a lesser degree than when the abutting layer is the second OTS switching layer 57. Instead, the curves are compressed into a depth distance about 10% to 25% of the illustrated depth.

Figure 30A:
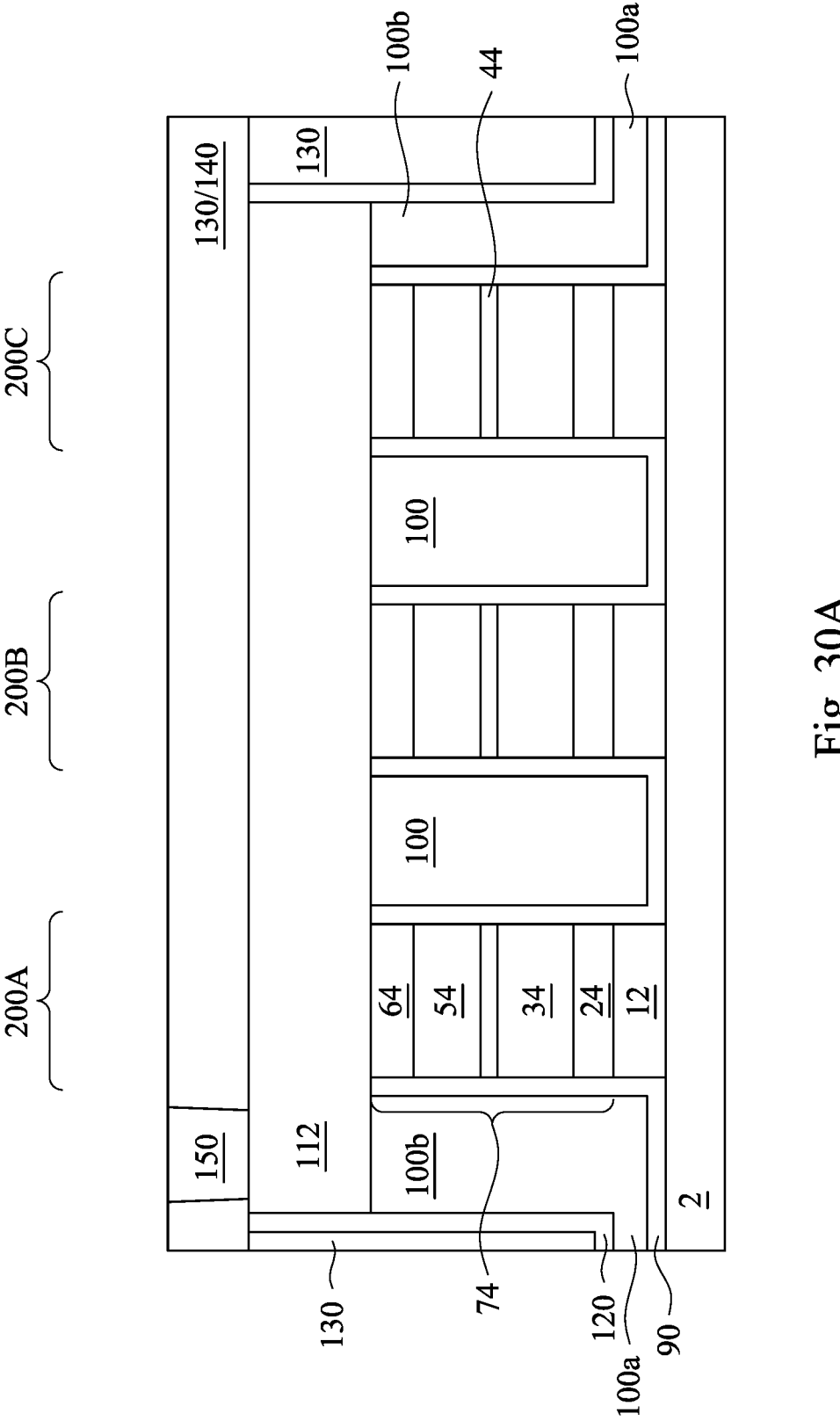
Figure 30B:
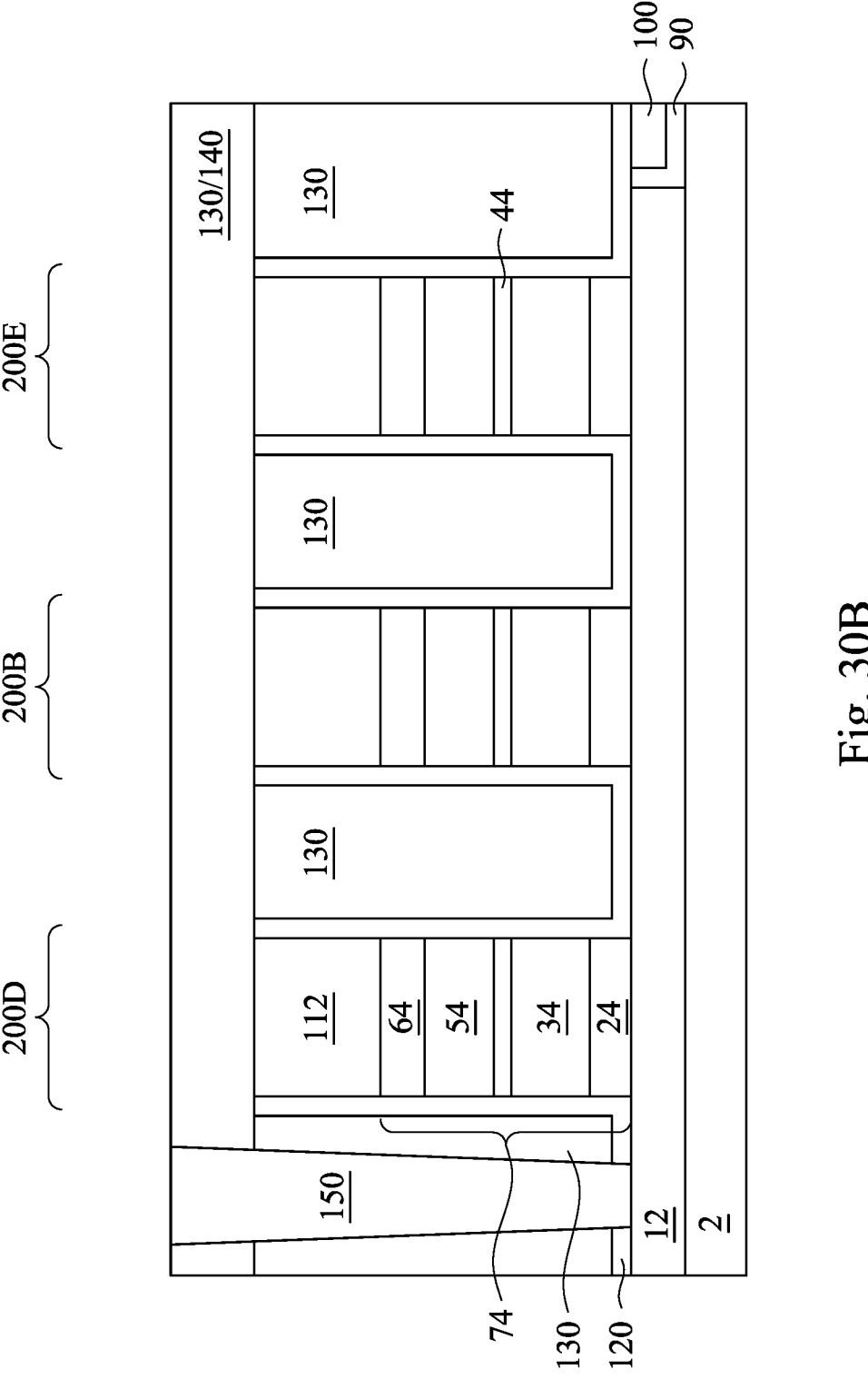

FIGS. 30A and 30B illustrate the formation of vias 150 to couple to the word lines 112 and the bitlines 12 to a metallization. In some embodiments, the dielectric fill 130 may not be planarized and instead it may remain for forming the vias 150. In other embodiments, a dielectric layer 140 is deposited over the word lines 112 and over the dielectric fill 130. Then openings may be formed through the dielectric layer 140 and the dielectric layer 130 corresponding to the vias 150. Then the vias 150 may be formed by depositing a conductive material in the openings. The vias 150 may be deposited by any suitable process, such as by ALD, CVD, plating, or the like. In some embodiments, a barrier layer may be formed between the dielectric layer 140 and the vias 150.

Figure 31A:
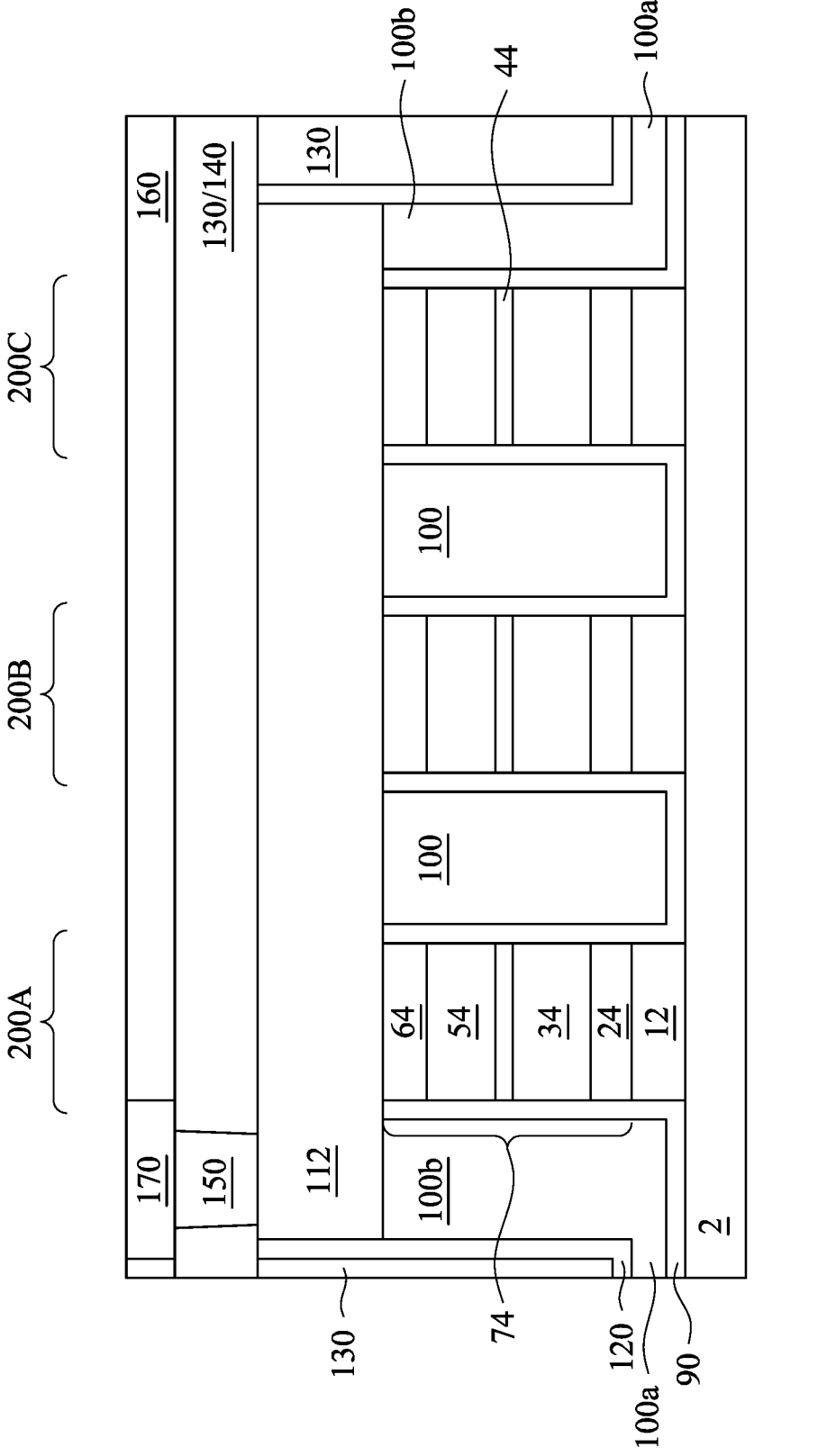
Figure 31B:
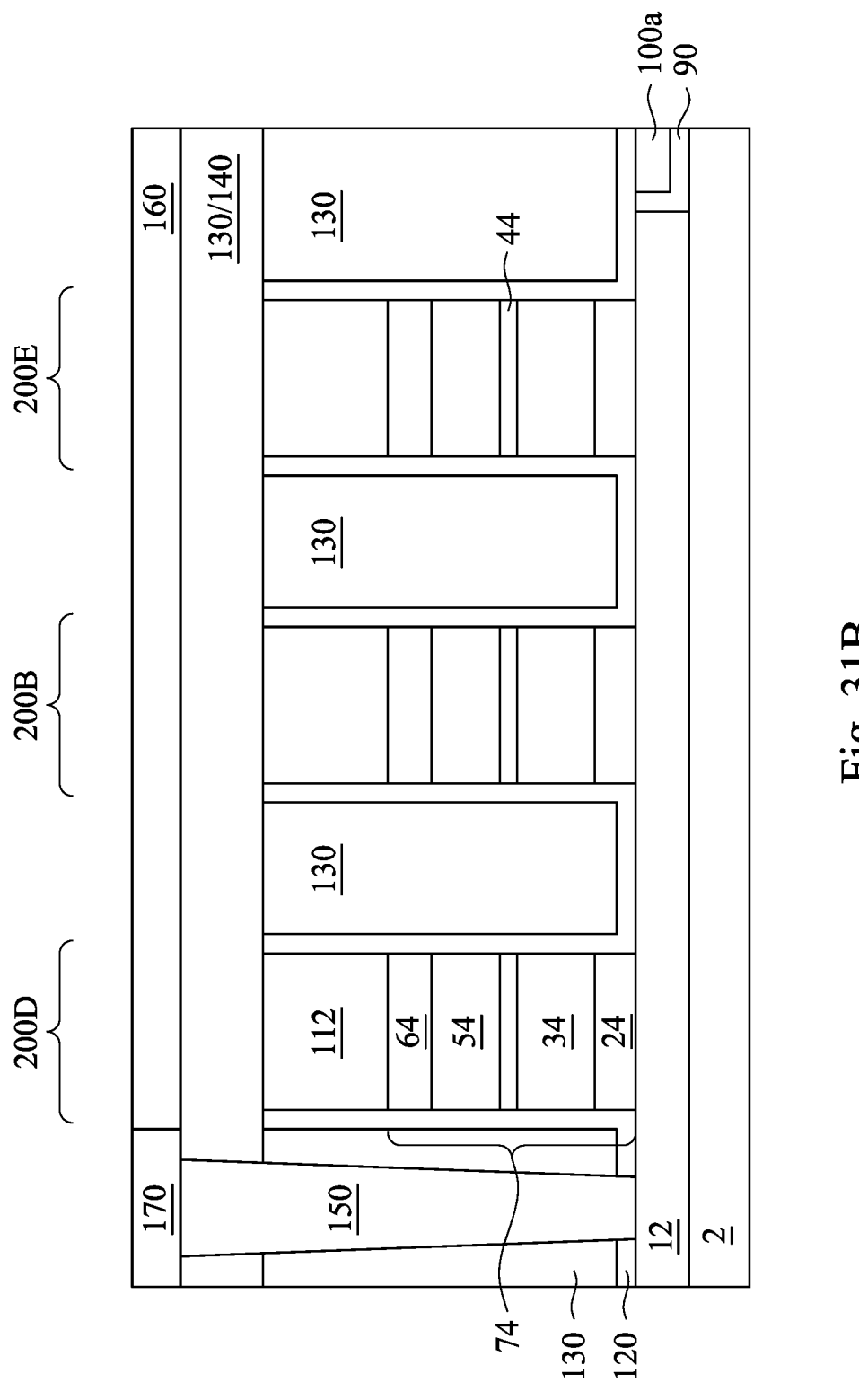

In FIGS. 31A and 31B a metallization 170 may be formed for forming metal pads over the vias 150. The metallization 170 may be formed by first depositing an insulating layer 160, such as an inter-layer dielectric (ILD) over the dielectric layer 140 and forming openings in the insulating layer 160 corresponding to the metallization pattern being formed. Then the metallization 170 may be formed by any suitable process, such as by as by ALD, CVD, plating, or the like. In some embodiments, a barrier layer may be formed between the dielectric layer 160 and the metallization 170.

Embodiments achieve advantages. Using a multi-layer selector structure provides improved switching performance, including sharper on/off switching profiles than single layer selector structures, and smaller cycle-to-cycle $V_{th}$ variation and smaller device-to-device $V_{th}$ variation. Having a gradual composition of the OTS switching further enhances device selector performance by reducing or eliminating interference with adjacent metal layers. Memory cells may be formed using a variety of configurations of the multi-layer selector structure and memory elements.

One embodiment is a method including forming a memory structure of a memory cell, the memory structure interposed between an upper electrode and lower electrode. The method also includes forming a selector structure of the memory cell, the selector structure interposed between the upper electrode and the lower electrode, the selector structure including a first material disposed in a first layer and a second material disposed in a second layer, the first material may include the second material and an additional element, the first material may include an ovonic threshold switching material. The method also includes forming a word line over the selector structure, the word line having a lengthwise direction perpendicular to a lengthwise direction of a bitline, the bitline disposed under the selector structure.

In an embodiment, a concentration of the first material in the first layer is substantially even throughout an entire thickness of the first layer. In an embodiment, a concentration of the second material in the second layer has a gradient change of concentration throughout a thickness of the second layer. In an embodiment, the gradient change of concentration includes two different slopes. In an embodiment, a first slope increases concentration of the second material in the second layer and a second slope decreases concentration of the second material in the second layer. In an embodiment, the second layer includes the additional element of the first layer in a gradient of concentration that increases to an interface between the first layer and the second layer. In an embodiment, the selector structure is disposed over the memory structure. In an embodiment, the method may include: forming an interfacial layer between the memory structure and the selector structure. In an embodiment, the selector structure includes a third layer may include a third material, the first layer interposed between the second layer and the third layer. In an embodiment, the third material is different than the second material of the second layer, where the first layer further may include the third material.

Another embodiment is a method including forming a bitline metal. The method also includes depositing a bottom electrode metal. The method also includes depositing memory layers over the bottom electrode metal. The method also includes depositing selector layers over the memory layers. The method also includes depositing a top electrode metal over the selector layers. The method also includes forming a first mask over the top electrode metal and patterning the top electrode metal, selector layers, memory layers, and bottom electrode metal into a set of strips corresponding to the bitline metal. The method also includes depositing an insulating layer laterally surrounding the set of strips. The method also includes forming a word line metal over the insulating layer and top electrode metal. The method also includes forming a second mask over the word line metal and patterning the word line metal. The method also includes patterning the word line metal and patterning the top electrode metal, the selector layers, the memory layers, and the bottom electrode metal using the second mask into a set of pillars, each pillar corresponding to a memory cell.

In an embodiment, the method may include: depositing a first selector layer may include a first ovonic threshold switching (OTS) material; and depositing a second selector layer may include a second OTS material, where the second OTS material may include a subset of the first OTS material. In an embodiment, depositing the selector layers further may include: depositing a third selector of a third OTS material, where the first selector layer is interposed between the second selector layer and the third selector layer, the first selector layer having a first shared interface with the second selector layer and a second shared interface with the third selector layer, the third OTS material may include a subset of the first OTS material. In an embodiment, the third OTS material is different than the second OTS material.

Another embodiment is a device, including a memory cell which may include: a memory structure, a selector structure, the selector structure may include a first material layer and a second material layer, where the second material layer may include a subset of materials from the first material layer, a top electrode, and a bottom electrode, the memory structure and selector structure interposed between the top electrode and the bottom electrode. The device also includes a bit line coupled to the bottom electrode. The device also includes a source line coupled to the top electrode.

In an embodiment, the selector structure further may include a third material layer, where the third material layer may include a subset of materials from the first material layer. In an embodiment, the third material layer and the second material layer have the same material composition. In an embodiment, a first concentration of first materials in the first material layer has a substantially steady concentration profile for an entire thickness of the first material layer. In an embodiment, a first percentage concentration of materials unique to the first material layer is greater than a second percentage concentration of materials common to both the first material layer and the second material layer. In an embodiment, the second material layer further may include a gradient percent concentration of materials of the first material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a memory structure of a memory cell, the memory structure interposed between an upper electrode and a lower electrode;

forming a selector structure of the memory cell, the selector structure interposed between the upper electrode and the lower electrode, the selector structure being between the memory structure and one of the upper electrode or the lower electrode, the selector structure including a first material disposed in a first layer and a second material disposed in a second layer, the first material comprising the second material and an additional element, the first material comprising an ovonic threshold switching material, wherein the second layer includes the additional element of the first layer in a gradient of concentration that increases to an interface between the first layer and the second layer; and forming a word line over the selector structure, the word line having a lengthwise direction perpendicular to a lengthwise direction of a bitline, the bitline disposed under the selector structure.

2. The method of claim 1, wherein a concentration of the first material in the first layer is even throughout an entire thickness of the first layer.

3. The method of claim 1, wherein a concentration of the second material in the second layer has a gradient change of concentration throughout a thickness of the second layer.

4. The method of claim 3, wherein the gradient change of concentration includes two different slopes.

5. The method of claim 4, wherein a first slope increases concentration of the second material in the second layer and a second slope decreases concentration of the second material in the second layer.

6. The method of claim 1, wherein the selector structure is disposed over the memory structure.

7. The method of claim 1, further comprising:

forming an interfacial layer between the memory structure and the selector structure.

8. The method of claim 1, wherein the selector structure includes a third layer comprising a third material, the first layer interposed between the second layer and the third layer.

9. The method of claim 8, wherein the third material is different than the second material of the second layer, wherein the first layer further comprises the third material.

10. The method of claim 1, wherein the selector structure is between the memory structure and the lower electrode.

11. The method of claim 1, wherein the selector structure is between the memory structure and the upper electrode.

12. A method comprising:

forming a bitline metal;

depositing a bottom electrode metal;

depositing memory layers over the bottom electrode metal;

depositing selector layers over the memory layers, wherein depositing the selector layers comprises:

depositing a first selector layer comprising a first ovonic threshold switching (OTS) material;

depositing a second selector layer comprising a second OTS material, wherein the first OTS material comprises a subset of the second OTS material; and depositing a third selector layer comprising a third OTS material, wherein the second selector layer is interposed between the first selector layer and the third selector layer, the second selector layer having a first shared interface with the first selector layer and a second shared interface with the third selector layer, the third OTS material comprising a subset of the second OTS material, wherein the third OTS material is different than the first OTS material;

depositing a top electrode metal over the selector layers;

forming a first mask over the top electrode metal and patterning the top electrode metal, selector layers, memory layers, and bottom electrode metal into a set of strips corresponding to the bitline metal;

depositing an insulating layer laterally surrounding the set of strips;

forming a word line metal over the insulating layer and top electrode metal;

forming a second mask over the word line metal; and patterning the word line metal and patterning the top electrode metal, the selector layers, the memory layers, and the bottom electrode metal using the second mask into a set of pillars, each pillar corresponding to a memory cell.

13. The method of claim 12, wherein a thickness of the second selector layer is greater than a thickness of the first selector layer and greater than a thickness of the third selector layer.

14. The method of claim 12, wherein the first selector layer and the third selector layer have a same thickness.

15. A method comprising:

forming a first electrode;

forming a memory structure and a selector structure; and forming a second electrode, wherein the memory structure and the selector structure are electrically between the first electrode and the second electrode, wherein the selector structure is electrically between the memory structure and the second electrode, wherein the selector structure includes a first material disposed in a first layer and a second material disposed in a second layer, the first material comprising an ovonic threshold switching material, wherein a concentration of the first material in the first layer is even throughout an entire thickness of the first layer.

16. The method of claim 15, wherein the first material comprises the second material and an additional element.

17. The method of claim 16, wherein the first layer has a higher resistance than the second layer.

18. The method of claim 15, wherein a concentration of the second material in the second layer has a gradient change of concentration throughout a thickness of the second layer.

19. The method of claim 15, wherein the selector structure further comprises the second material in a third layer, wherein the first layer is between the second layer and the third layer.

20. The method of claim 19, wherein the first layer is thicker than the second layer and the third layer.

\* \* \* \* \*